US009564289B2

(12) United States Patent
Kagawa et al.

(10) Patent No.: US 9,564,289 B2
(45) Date of Patent: Feb. 7, 2017

(54) ION IMPLANTER AND METHOD OF CONTROLLING THE SAME

(71) Applicant: Sumitomo Heavy Industries Ion Technology Co., Ltd., Tokyo (JP)

(72) Inventors: Tadanobu Kagawa, Ehime (JP); Toshio Yumiyama, Ehime (JP); Takeshi Kurose, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/793,265

(22) Filed: Jul. 7, 2015

(65) Prior Publication Data
US 2016/0013014 A1 Jan. 14, 2016

(30) Foreign Application Priority Data

Jul. 9, 2014 (JP) ................................. 2014-141481

(51) Int. Cl.
*H01J 37/317* (2006.01)
*H01J 37/24* (2006.01)

(52) U.S. Cl.
CPC .......... *H01J 37/241* (2013.01); *H01J 37/3171* (2013.01)

(58) Field of Classification Search
None
See application file for complete search history.

(56) References Cited

U.S. PATENT DOCUMENTS

| 6,423,976 B1* | 7/2002 | Glavish | H01J 37/3171 250/492.21 |
| 7,603,902 B2 | 10/2009 | Katashi | |
| 2007/0164237 A1* | 7/2007 | Bernhardt | H01J 37/248 250/492.21 |
| 2014/0150723 A1* | 6/2014 | Kabasawa | H01J 37/32412 118/723 R |
| 2015/0136996 A1* | 5/2015 | Inada | H01J 37/3171 250/396 R |

FOREIGN PATENT DOCUMENTS

| JP | H10-112277 A | 4/1998 |
| JP | 2008-304262 A | 12/2008 |

* cited by examiner

*Primary Examiner* — Michael Logie
(74) *Attorney, Agent, or Firm* — Michael Best & Friedrich LLP

(57) ABSTRACT

An ion implanter includes a high-voltage power supply, a control unit that generates a command signal controlling an output voltage of the high-voltage power supply, an electrode unit to which the output voltage is applied, and a measurement unit that measures an actual voltage applied to the electrode unit. The control unit includes a first generation section that generates a first command signal for allowing the high-voltage power supply to output a target voltage, a second generation section that generates a second command signal for complementing the first command signal so that the actual voltage measured by the measurement unit becomes or close to the target voltage, and a command section that brings to the high-voltage power supply a synthetics command signal which is produced by synthesizing the first command signal and the second command signal.

18 Claims, 14 Drawing Sheets ly performed for the purpose of changing a conductive property, changing a crystal structure of the semiconductor, and the like. An apparatus used in the ion implantation process is called an ion implanter, and the ion implanter functions to generate ions in an ion source and accelerate the generated ions to generate an ion beam and functions to transport the ion beam to a vacuum processing chamber and irradiate the wafer in the processing chamber with the ion beam.

ION IMPLANTER AND METHOD OF CONTROLLING THE SAME

RELATED APPLICATION

Priority is claimed to Japanese Patent Application No. 2014-141481, filed on Jul. 9, 2014, the entire content of which is incorporated herein by reference.

BACKGROUND OF THE INVENTION

1. Field of the Invention

The present invention relates to an ion implanter.

2. Description of the Related Art

In a semiconductor production process, a process of implanting ions into a semiconductor wafer (hereinafter sometimes referred to as "an ion implantation process") is generally performed for the purpose of changing a conductive property, changing a crystal structure of the semiconductor, and the like. An apparatus used in the ion implantation process is called an ion implanter, and the ion implanter functions to generate ions in an ion source and accelerate the generated ions to generate an ion beam and functions to transport the ion beam to a vacuum processing chamber and irradiate the wafer in the processing chamber with the ion beam.

In the ion implanter, an ion source, an extraction electrode, a mass analysis magnet unit, a beam scanning unit, a beam collimating unit, an angular energy filter unit, a wafer processing chamber, and the like are arranged along a beamline, for example, and the ion implanter is configured to implant ions into a wafer which may be a semiconductor substrate. These units constituting the beamline control an ion beam with use of an electric field generated between electrodes to which voltage has been applied and/or a magnetic field generated by the magnet unit. For example, to control voltage to be applied between electrodes of a unit constituting the beamline, a high-output dedicated power supply and a low-output dedicated power supply are used in combination.

When the voltage to be applied between the electrodes of the unit constituting the beamline changes, an trajectory of the ion beam to be transported along the beamline and an incident angle to the wafer can change. When the trajectory of the ion beam and the incident angle to the wafer change, a state of interaction between the ion beam and the wafer may change, which may influence a processing result of ion implantation.

SUMMARY OF THE INVENTION

An exemplary illustrative object of an aspect of the present invention is to provide a technique of increasing accuracy of a voltage applied to an electrode unit.

An ion implanter according to an aspect of the present invention includes a high-voltage power supply, a control unit that generates a command signal controlling an output voltage of the high-voltage power supply, an electrode unit to which the output voltage is applied, and a measurement unit that measures an actual voltage applied to the electrode unit. The control unit includes a first generation section that generates a first command signal for allowing the high-voltage power supply to output a target voltage, a second generation section that generates a second command signal for complementing the first command signal so that the actual voltage measured by the measurement unit becomes the target voltage or a voltage close to the target voltage, and a command section that brings to the high-voltage power supply a synthetic command signal which is produced by synthesizing the first command signal and the second command signal.

According to another aspect of the present invention, a method of controlling an ion implanter is provided. This method is a method of controlling an ion implanter including a high-voltage power supply, a control unit that generates a command signal controlling an output voltage of the high-voltage power supply, an electrode unit to which the output voltage is applied, and a measurement unit that measures an actual voltage applied to the electrode unit. This method includes generating a first command signal for allowing the high-voltage power supply to output a target voltage, generating a second command signal for complementing the first command signal so that the actual voltage measured by the measurement unit becomes the target voltage or a voltage close to the target voltage, and bringing to the high-voltage power supply a synthetic command signal which is produced by synthesizing the first command signal and the second command signal.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, byway of example only, with reference to the accompanying drawings that are meant to be exemplary, not limiting, and wherein like elements are numbered alike in several figures, in which.

DETAILED DESCRIPTION OF THE INVENTION

Figure 1:
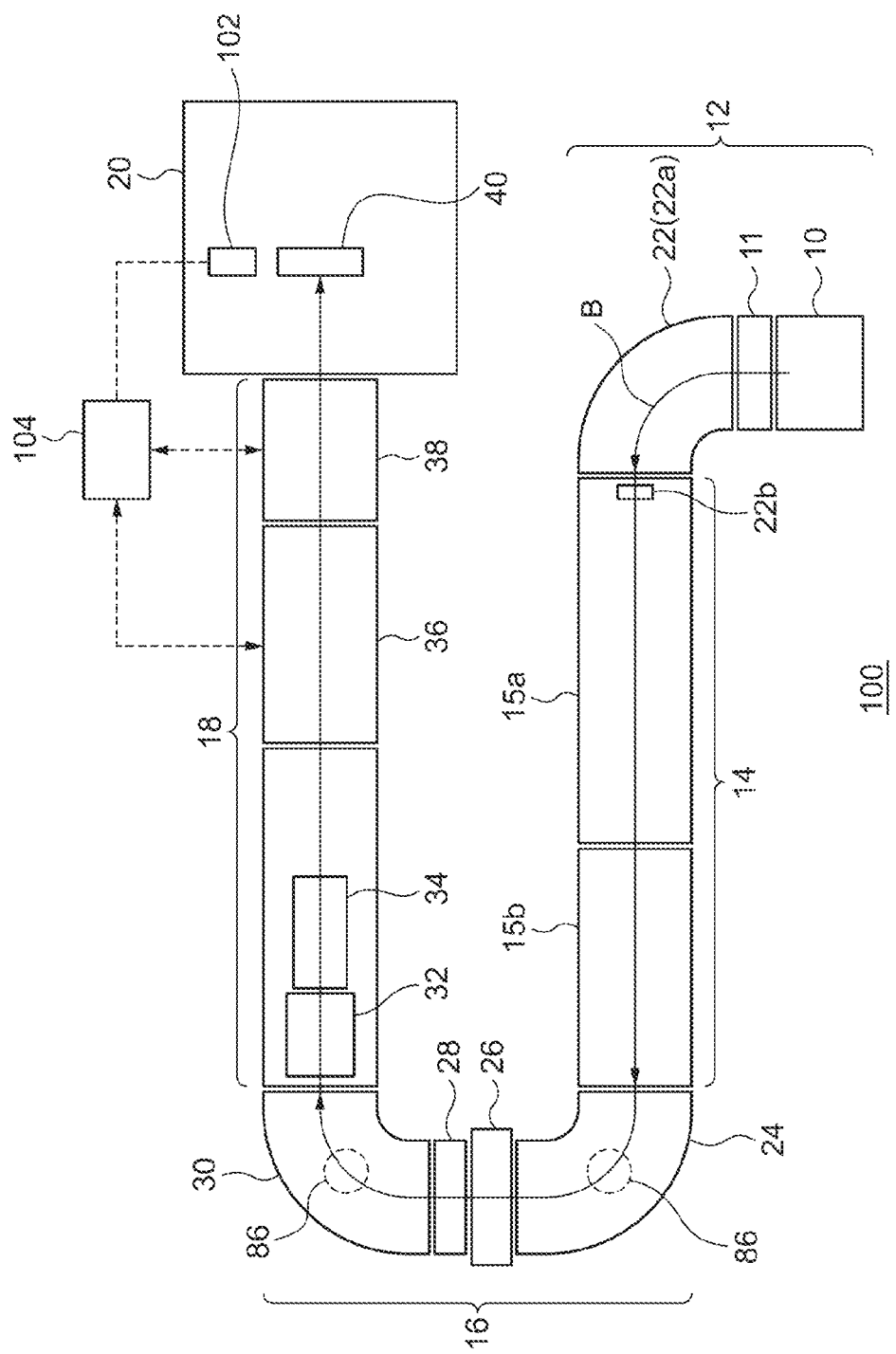
FIG. 1 is a schematic top view of an ion implanter according to an embodiment of the present invention.

The invention will now be described by reference to the preferred embodiments. This does not intend to limit the scope of the present invention, but to exemplify the invention.

Hereinbelow, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

FIG. 1 is a schematic top view of an ion implanter 100 according to an embodiment of the present invention. FIG. 1 shows a layout of components constituting a beamline unit of the ion implanter 100. The beamline unit of the ion implanter 100 includes an ion source 10 and a processing chamber for a workpiece and is configured to transport an ion beam B from the ion source 10 to the workpiece (e.g., a substrate or a wafer 40).

In this document, for convenience of description, a direction along a reference trajectory in the beamline unit is referred to as a z direction, and a direction perpendicular to the z direction is referred to as an x direction. Also, a direction perpendicular to the z direction and the x direction is referred to as a y direction. In the present embodiment, the x direction is a horizontal direction while the y direction is a vertical direction.

The ion implanter 100 is applied to a so called high energy ion implanter. The high energy ion implanter is an ion implanter that includes a radio frequency linear acceleration type ion accelerator and a high energy ion transportation beamline. The high energy ion implanter is configured to accelerate ions generated by the ion source 10 to have high energy, transport the ions along a beamline to the workpiece as the ion beam B, and implants the ions into the workpiece.

As illustrated in FIG. 1, the ion implanter 100 includes an ion beam generation unit 12 that generates ions and separates the ions by mass analysis, a high energy multistage linear acceleration unit 14 that accelerates an ion beam so as to become a high energy ion beam, a beam deflection unit 16 that bends an trajectory of the high energy ion beam in a U-shape, a beam transportation line unit 18 that transports the high energy ion beam to the wafer 40, and a substrate processing/supplying unit 20 that uniformly implants the transported high energy ion beam into the semiconductor wafer.

The ion beam generation unit 12 includes the ion source 10, an extraction electrode 11, and a mass analyzer 22. In the ion beam generation unit 12, ions are extracted from the ion source 10 through the extraction electrode 11 and is accelerated resulting in an ion beam, and the extracted and accelerated ion beam is subjected to a mass analysis by the mass analyzer 22. The mass analyzer 22 includes a mass analysis magnet 22a and amass analysis slit 22b. There is a case in which the mass analysis slit 22b is disposed directly behind the mass analysis magnet 22a. However, in the embodiment, the mass analysis slit 22b is disposed inside the entrance of the high energy multistage linear acceleration unit 14 which is the next component.

Only the ion species necessary for the implantation are selected as a result of the mass analysis using the mass analyzer 22, and the ion beam of the selected ion species is led to the next high energy multistage linear acceleration unit 14. The high energy multistage linear acceleration unit 14 includes a first linear accelerator 15a including a plurality of stages of basic radio frequency resonators for high energy ion implantation. The high energy multistage linear acceleration unit 14 may include a second linear accelerator 15b including a plurality of stages of additional radio frequency resonators for super high energy ion implantation. The traveling direction of the ion beam accelerated by the high energy multistage linear acceleration unit 14 is changed by the beam deflection unit 16.

The high energy ion beam that exits from the radio frequency (AC-type) high energy multistage linear acceleration unit 14 for highly accelerating the ion beam includes a certain range of energy distribution. For this reason, in order to scan and collimate the high energy ion beam in the rear stage and irradiate the wafer moving in a mechanical scan state with the high energy ion beam, there is a need to perform a highly accurate energy analysis, center trajectory correction, and beam focusing/defocusing adjustment in advance.

The beam deflection unit 16 performs the energy analysis, the center trajectory correction, and the energy dispersion control on the high energy ion beam. The beam deflection unit 16 includes at least two highly accurate deflection electromagnets, at least one energy width limiting slit, at least one energy analysis slit, and at least one horizontal focusing unit. The plurality of deflection electromagnets are arranged so as to perform the energy analysis of the high energy ion beam, the accurate correction of the ion implantation angle, and the suppression of the energy dispersion.

The beam deflection unit 16 includes an energy analysis electromagnet 24, a horizontally focusing quadrupole lens 26 that suppresses energy dispersion, an energy analysis slit 28, and a steering electromagnet 30 providing beam steering (trajectory correction). The energy analysis electromagnet 24 is one at the most upstream side out of the plurality of deflection electromagnets in the beam deflection unit 16. The steering electromagnet 30 is one at the most downstream side out of the plurality of deflection electromagnets in the beam deflection unit 16. Meanwhile, the energy analysis electromagnet 24 may be called an energy filter electromagnet (EFM). The traveling direction of the high energy ion beam is changed by the beam deflection unit 16 so as for the beam to be directed toward the wafer 40.

The ions that pass through the deflection electromagnets of the beam deflection unit 16 are subjected to a centrifugal force and a Lorentz force, and hence draws a circular-arc trajectory by balance of these forces. This balance is represented by a relation of mv=qBr. Here, m indicates the mass of the ion, v indicates the velocity of the ion, q indicates the electric charge of the ion, B indicates the magnetic flux density of the deflection electromagnet, and r indicates the curvature radius of the trajectory. Only the ions of which the curvature radius r of the trajectory matches the curvature radius of the magnetic pole center of the deflection electromagnet may pass through the deflection electromagnet. In other words, in a case in which the ions have the same electric charge, the ions that may pass through the deflection electromagnet applied with the uniform magnetic field B are only the ions having the specific momentum mv. The EFM is called the energy analysis electromagnet, but is actually a device that is used to analyze the momentum of the ion. A bending magnet (BM) or a mass analysis electromagnet of an ion generation unit is a momentum filter.

Further, the beam deflection unit 16 may deflect the ion beam by 180° just by using a plurality of magnets. Accordingly, the high energy ion implanter in which the beamline has a U shape may be configured with a simple configuration.

As described above, the beam deflection unit 16 performs the deflection of the ion beam by 180° by using a plurality of electromagnets between the high energy multistage linear acceleration unit 14 and the beam transportation line unit 18 in the ion implanter that accelerates the ions generated from the ion source and transports the ions to the wafer so as to implant the ions thereto. The energy analysis electromagnet 24 and the steering electromagnet 30 are respectively formed so as to have deflection angles of 90°. As a result, the total deflection angle becomes 180°. Furthermore, the amount of the deflection performed by each magnet is not limited to 90°, and the following combination may be available.

(1) One magnet having deflection amount of 90° and the other two magnets having deflection amounts of 45°
(2) Three magnets having deflection amounts of 60°
(3) Four magnets having deflection amounts of 45°
(4) Six magnets having deflection amounts of 30°
(5) One magnet having deflection amount of 60° and the other magnet having deflection amount of 120°
(6) One magnet having deflection amount of 30° and the other magnet having deflection amount of 150°

Since the energy analysis electromagnet 24 needs high magnetic field accuracy, a highly accurate magnetic field measurement device 86 for accurately measuring the magnetic field is provided. The measurement device 86 is appropriate combination of an NMR (nuclear magnetic resonance) probe, which may be referred to as an MRP (magnetic resonance probe), and a Hall probe. The MRP is used to calibrate the Hall probe, and the Hall probe is used in a feedback control for a determinate magnetic field. Further, the energy analysis electromagnet 24 is produced with strict accuracy so that non-uniformity of the magnetic field becomes less than 0.01%. The steering electromagnet 30 is similarly provided with a magnetic field measurement device 86. The magnetic field measurement device 86 of the steering electromagnet 30 may be provided with a Hall probe only. Further, each of the energy analysis electromagnet 24 and the steering electromagnet 30 is connected with a power supply and its control device that provide current setting accuracy and current stability of $1 \times 10^{-4}$ or less.

The beam transportation line unit 18 is used to transport the ion beam B exiting from the beam deflection unit 16, and includes a beam focusing/defocusing device 32 formed by a focusing/defocusing lens group, a beam scanner 34, a beam collimator 36, and an electrostatic final energy filter 38 (with a final energy separation slit). The length of the beam transportation line unit 18 is designed so as to match the total length of the ion beam generation unit 12 and the high energy multistage linear acceleration unit 14. The beam transportation line unit 18 is connected to the high energy multistage linear acceleration unit 14 via the beam deflection unit 16 so as to form a U-shaped layout as a whole.

Figure 2:
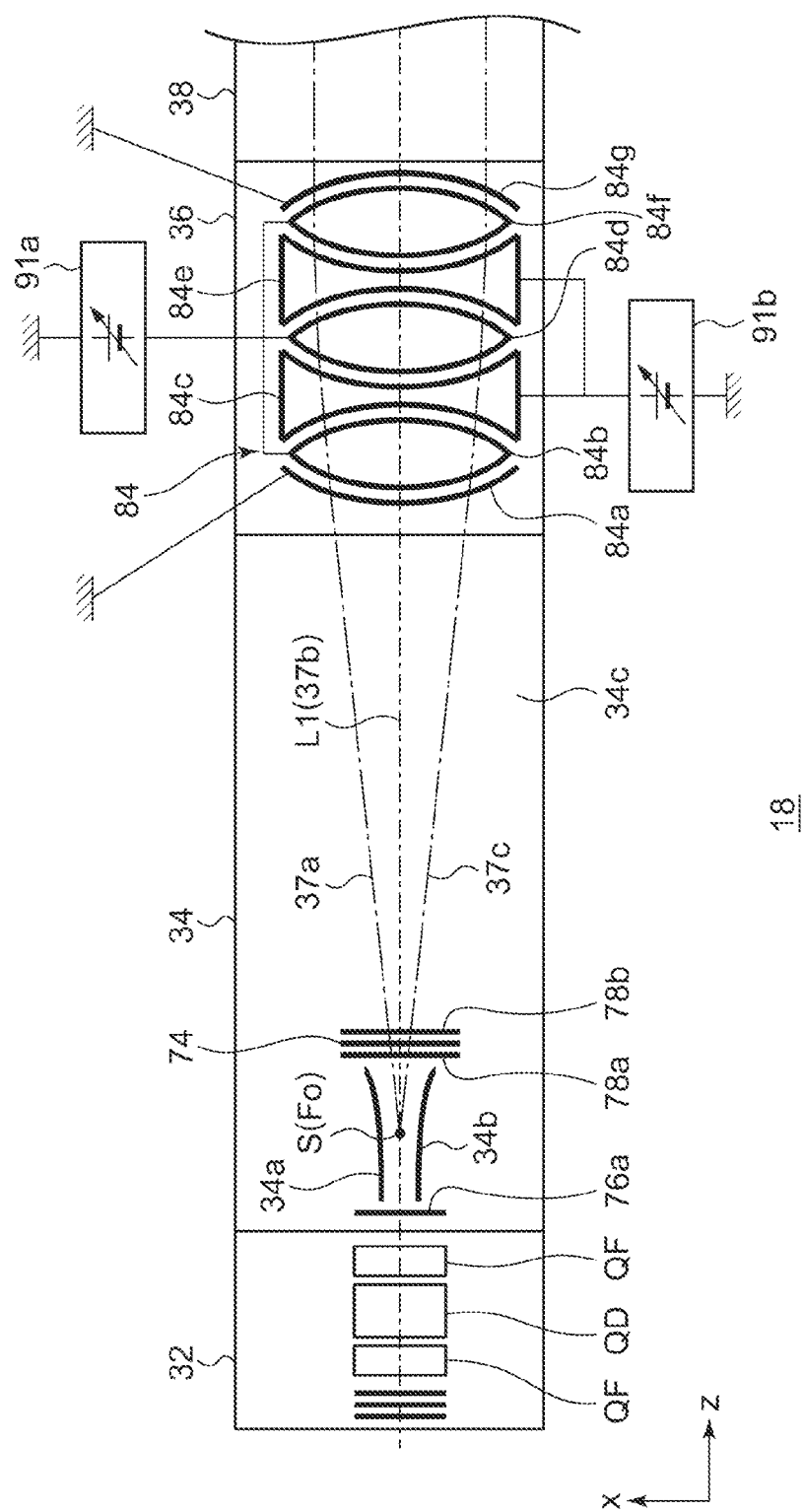
FIG. 2 is a plan view illustrating a partial schematic configuration of a beam transportation line unit illustrated in FIG. 1.

FIG. 2 is a plan view illustrating a partial schematic configuration of the beam transportation line unit 18. Only the necessary ion species are separated by the beam deflection unit 16 (refer to FIG. 1), and the ion beam that is consist of the ions having a necessary energy value is focused/defocused in a desired cross-sectional shape by the beam focusing/defocusing device 32. As illustrated in the figure, the beam focusing/defocusing device 32 is configured as (an electric field type or a magnetic field type) focusing/defocusing lens group such as a plurality of Q (quadrupole) lenses. The ion beam having a adjusted cross-sectional shape is scanned in a direction parallel to the sheet surface of FIG. 2 by the beam scanner 34. For example, the beam focusing/defocusing device is configured as a triplet Q lens group including a horizontal focusing (vertical defocusing) lens QF/a horizontal defocusing (a vertical focusing) lens QD/a horizontal focusing (a vertical defocusing) lens QF. If necessary, the beam focusing/defocusing device 32 may be configured by each of the horizontal focusing lens QF and the horizontal defocusing lens QD or the combination thereof.

The beam scanner 34 is configured to scan the ion beam by deflecting the ion beam in the x direction at a scan origin S at a periodically changing deflection angle. The scan origin S is an intersection point of an extension L1 (37b) of an entrance beam trajectory to the beam scanner 34 and an extension of an exit beam trajectory 37a and 37c from the beam scanner 34.

The beam scanner 34 is a deflection scan device that causes the ion beam to be periodically scanned in the horizontal direction perpendicular to the ion beam traveling direction in a reciprocating manner by the periodically changing electric field. As illustrated in FIG. 2, the beam scanner 34 includes a pair of (two) scan electrodes 34a and 34b (bipolar deflection scan electrodes) that are disposed so as to face each other with the ion beam passage region interposed therebetween with respect to the beam traveling direction. Then, a scan voltage that changes to positive and negative values at a predetermined frequency in the range of 0.5 Hz to 4000 Hz and is approximated to the triangular wave is applied to the two scan electrodes 34a and 34b with opposite polarity each other. The scan voltage generates a changing electric field that deflects the beam passing through the gap between the two scan electrodes 34a and 34b. Then, the beam that passes through the gap is scanned in the horizontal direction by the periodic change of the scan voltage.

A suppression electrode 74 that includes an opening in the ion beam passage region is disposed between two ground electrodes 78a and 78b at the downstream side of the beam scanner 34. A ground electrode 76a is disposed at the upstream side of the scan electrodes, but if necessary, a suppression electrode unit having the same configuration as that of the downstream side may be disposed. The suppression electrode suppresses the intrusion of electrons to the positive electrode.

A beam scan space portion 34c is provided in a long section at the downstream side of the beam scanner 34 inside a scan housing, and hence a sufficient scan width may be obtained even when the beam scan angle is narrow. At the rear side of the scan housing located at the downstream side of the beam scan space portion 34c, the beam collimator 36 is installed such that the deflected ion beam is adjusted to be directed to the direction of the ion beam before the ion beam is deflected. That is, the beam collimator 36 bends the ion beam again so as to be parallel to the extension L1.

Since the aberration (a difference in focal distance between the center portion of the beam collimator and right/left end of that) generated by the beam collimator 36 is proportional to the square of the deflection angle of the beam scanner 34, the aberration of the beam collimator 36 may be largely suppressed when the beam scan space portion 34c is increased in length and the deflection angle is decreased. If the aberration is large, the center portion and the right/left end of the semiconductor wafer receive different beam sizes and different beam divergence angles when the ion beam is implanted into the semiconductor wafer, and hence the quality of the product may become non-uniform.

Further, when the length of the beam scan space portion 34c is adjusted, the length of the beam transportation line unit may match the length of the high energy multistage linear acceleration unit 14.

The beam collimator 36 is configured to collimate the ion beam incident from the beam scanner 34 and forms at the downstream thereof a beam passage region extending along the x direction (the horizontal direction). The beam collimator 36 is an electrostatic beam collimator, for example.

The beam collimator 36 is provided with an electric field collimating lens 84. As illustrated in FIG. 2, the collimating lens 84 includes a plurality of pairs of acceleration electrodes and a plurality of pairs of deceleration electrodes substantially having a hyperbolic shape. The electrodes of each pair face each other across an acceleration or deceleration gap interposed therebetween and having a width not causing a discharge. An electric field having an axial component causing acceleration or deceleration of the ion beam and a lateral component increasing in proportional to a distance from the reference axis and influencing the horizontal focusing of the ion beam is formed in the acceleration or deceleration gap.

The downstream electrode in the pair of electrodes with the acceleration gap interposed therebetween and the upstream electrode of the deceleration gap are formed as an integrated structure, and the downstream electrode of the deceleration gap and the upstream electrode of the next acceleration gap are formed as an integrated structure, so as to have the same potential respectively.

As the collimating lens 84 is seen from the upstream side, an entrance electrode 84a serving as a first electrode and an exit electrode 84g serving as a final electrode are maintained at the ground potential. Accordingly, the energy of the ion beam at the positions before and behind the collimating lens 84 does not change.

In the intermediate electrode structure of the collimating lens 84, first electrode assemblies 84b, 84d, and 84f each constituting the exit side electrode of the acceleration gap and the entrance side electrode of the deceleration gap are connected with a negative power supply 91a configured to apply a variable constant voltage for the collimating lens. Also, second electrode assemblies 84c and 84e each constituting the exit side electrode of the deceleration gap and the entrance side electrode of the acceleration gap are connected with a positive power supply 91b configured to apply a variable constant voltage for the collimating lens. Accordingly, the ion beam is gradually directed toward the direction parallel to the reference trajectory of the beamline while being accelerated and decelerated repeatedly. Finally, the ion beam reaches the trajectory parallel to the ion beam traveling direction (the beamline trajectory direction) before the deflection scanning operation.

As illustrated in FIG. 2, the beam collimator 36 has a focal point $F_0$ on the reference trajectory (e.g., the extension L1 illustrated in FIG. 2). A plurality of beam trajectories 37a, 37b, and 37c incident to the beam collimator 36 respectively have different angles with respect to the reference trajectory. The beam collimator 36 is designed to deflect each of the plurality of beam trajectories 37a, 37b, and 37c at a different deflection angle in accordance with the incident angle so that the plurality of beam trajectories 37a, 37b, and 37c are parallel to the reference trajectory. The beam collimator 36 is operated when it receives electric input (e.g., voltage) predetermined in accordance with given conditions of ion implantation (e.g., conditions including target beam energy).

The plurality of beam trajectories 37a, 37b, and 37c are on a plane containing the reference trajectory, on which the beam trajectories 37a, 37b, and 37c are respectively directed from the focal point $F_0$ to the beam collimator 36 at different incident angles. Since the plurality of beam trajectories 37a, 37b, and 37c are results of scanning by the beam scanner 34 in the present embodiment, this plane is equivalent to a scan plane (an xz plane) of the beam scanner 34. Any of the beam trajectories (here, the beam trajectory 37b in FIG. 2) may correspond to the reference trajectory. In the present embodiment illustrated in FIG. 2, the reference trajectory is not deflected by the beam collimator 36 but goes straight in the beam collimator 36.

The ion implanter 100 according to the present embodiment is configured so that the focal point $F_0$ of the beam collimator 36 corresponds to the scan origin S of the beam scanner 34. Accordingly, the ion beam that is scanned by the beam scanner 34 at the scan origin S is focused by the beam collimator 36 including the electric field collimating lens and the like and becomes parallel to the axis (the reference axis) of the deflection angle 0° which is parallel to the ion beam traveling direction (the beamline trajectory direction) before the scan operation. At this time, the scan region is formed so as to be bilaterally symmetrical to each other with respect to the reference axis.

In this manner, the beam transportation line unit 18 scans and collimates the high energy ion beam. The collimated ion beam is supplied via the final energy filter 38 to the substrate processing/supplying unit 20. The wafer 40 moving in a mechanical scan state is irradiated with the collimated ion beam with high accuracy, and the ions are implanted to the wafer 40.

Figure 3:
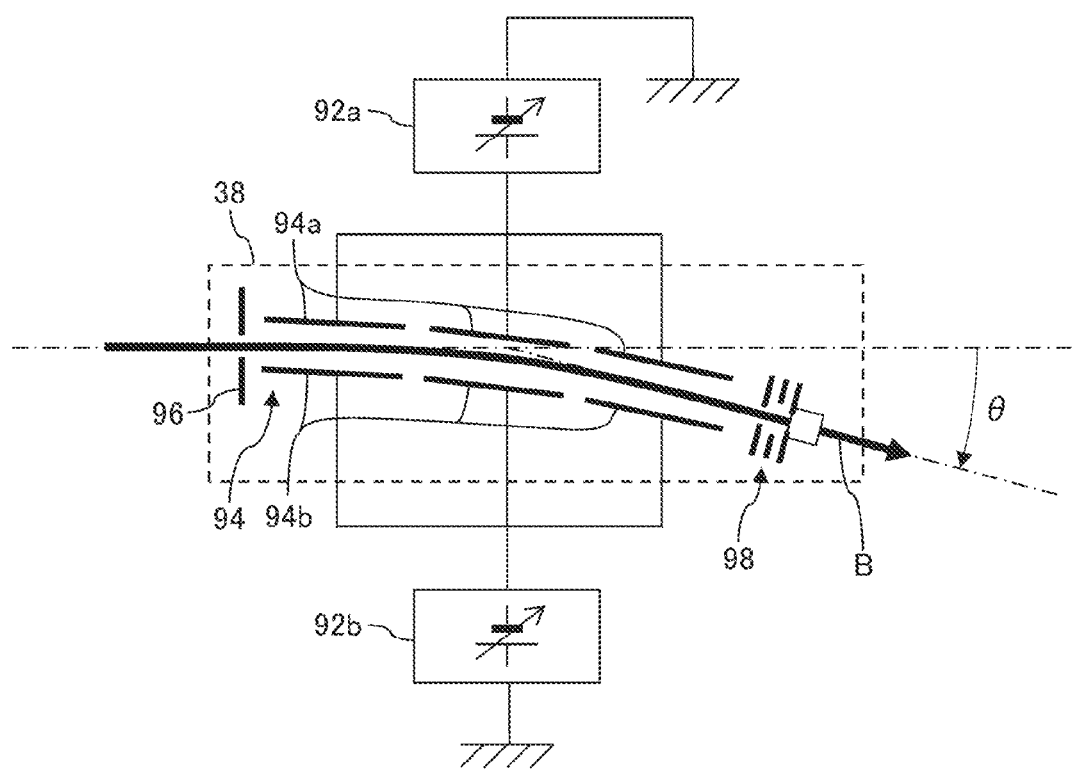
FIG. 3 is a side view illustrating a schematic configuration of a final energy filter illustrated in FIG. 1.

FIG. 3 is a side view illustrating a schematic configuration of the final energy filter 38 illustrated in FIG. 1. The ion beam that is emitted from the beam collimator 36 is transported to the final energy filter 38, which is an angular energy filter (AEF: Angular Energy Filter). In the final energy filter 38, a final analysis is performed with respect to the energy of the ion beam to be directly implanted into the wafer, only the ion species having a desired energy value are selected, and the neutralized particles not having electric charges or the ions having electric charges different from a predetermined value are removed. The final energy filter 38 is configured so as to have AEF electrodes 94, which are plate-shaped deflection electrodes including at least a pair of plane or curved surfaces facing each other in the vertical direction relative to the beamline trajectory direction. The AEF electrodes 94 are curved downward in accordance with the deflection action of the final energy filter 38 in the vertical direction relative to the beamline trajectory direction and is curved so as to match the ion beam trajectory.

As illustrated in FIG. 3, the electric field deflection electrodes are configured at least as a pair of AEF electrodes 94, and is disposed so that the ion beam is interposed therebetween in the vertical direction. In at least the pair of AEF electrodes 94, an upper AEF electrode 94a is connected with a positive power supply 92a configured to apply a positive voltage, and a lower AEF electrode 94b is connected with a negative power supply 92b configured to apply a negative voltage. During the deflection by the electric field, the ion beam is deflected downward by an angle θ which is about 10 to 20° by the action of the electric field generated between at least the pair of AEF electrodes 94, and hence only the ion beam having target energy is selected. Also, only the ion beam having a selected electric charge is deflected downward at the set trajectory angle θ in the final energy filter 38. The ion beam that is consist of the ion species selected in this way is uniformly irradiated to the wafer 40 which is the irradiation target at an accurate angle.

In a case where the high-energy beam is actually deflected, at least a pair of plate-shaped AEF electrodes 94 facing each other in the vertical direction may be divided into n number of segments (n is an integer of at least 2) in the longitudinal direction in accordance with the deflection angle and the curvature radius when the deflection electrodes are curved so as to match the ion beam trajectory as illustrated in FIG. 3. In this way, the production accuracy or the economic efficiency is improved in the plate-shaped electrodes where each set of the upper electrodes and the lower electrodes is maintained at the same potential. For example, the pair of AEF electrodes 94 is divided into three as illustrated in the figure. Further, the plate-shaped deflection electrodes that are divided into n number of segments in the longitudinal direction may be formed as n number of upper and lower plate-shaped electrodes set to different potentials other than the configuration in which each set of the upper electrodes and the lower electrodes are maintained at the same potential.

With such a structure, the electric field type energy filter may be mounted on the high-energy scan beam transportation line. Since the ion beam is deflected in a direction perpendicular to the beam scan plane by the electric field, the energy analysis may be performed without influencing the implantation ion density distribution (that is the uniformity) in the beam scan direction.

Further, by installing the final energy filter 38, the beamline is equipped with three kinds of beam filters, in addition to the radio frequency linear accelerator of the high energy multistage linear acceleration unit 14 and the set of the energy analysis electromagnet 24 and the steering electromagnet 30 of the beam deflection unit 16. As described above, the high energy multistage linear acceleration unit 14 is the velocity (v) filter, the beam deflection unit 16 is the momentum (mv) filter, and the final energy filter 38 is the energy ($mv^2/2$) filter as its name. In this way, when the different triple filters are used, a very pure ion beam that has high energy purity, a small amount of particles or metal contamination compared to the related art may be supplied to the wafer.

Meanwhile, in terms of function, the energy analysis electromagnet 24 may remove the energy contamination sneaking through the high energy multistage linear acceleration unit 14 and/or limit the energy width with high resolution. Also, the final energy filter 38 may mainly remove the ions subjected to a change in the electric charge in the resist outgas by the beam transportation line unit after the energy analysis using the energy analysis electromagnet 24 with comparatively low resolution.

The final energy filter 38 includes a ground electrode 96 that is provided at the upstream side of the AEF electrodes 94 and a suppression electrode unit 98 provided at the downstream side thereof. The suppression electrode unit 98 has a configuration in which one suppression electrode is provided between two ground electrodes and suppresses the intrusion of the electrons to the upper AEF electrode 94a to which a positive voltage is applied.

As illustrated in FIG. 1, the substrate processing/supplying unit 20 is provided at the termination end of the downstream side of the beam transportation line unit 18, and the implantation processing chamber accommodates a beam monitor 102 that measures the current, the position, the implantation angle, the convergence and divergence angle, the vertical and horizontal ion distribution, and the like of the ion beam B, a charge-up suppression device that prevents charge-up phenomenon on the wafer 40 by the ion beam B, a wafer conveyance mechanism that carries the wafer 40 and sets the wafer 40 at an appropriate position and an appropriate angle, an ESC (electrostatic chuck) that holds the wafer 40 during the ion implantation, and a wafer scan mechanism that moves the wafer 40 in a direction perpendicular to the beam scan direction at the velocity in response to a change in the implantation beam current. The substrate processing/supplying unit 20 is configured to provide mechanical scan of the wafer 40.

The beam monitor 102 is configured to measure an x-direction implantation angle of the ion beam B to the workpiece. The beam monitor 102 is a high-accuracy angle monitor that measures a beam angle with a measurement error of 0.1° or less, for example. The beam monitor 102 is also configured to measure an x-direction implantation position of the ion beam B on the workpiece. Thus, the beam monitor 102 is a position monitor of the ion beam as well. The beam monitor 102 measures the ion beam B at a position where the ions will be implanted into the workpiece or a measurement position close to the position in advance and, during the implantation process, the beam monitor 102 retreats from the measurement position to stop measurement or monitors the beam at a position close to the measurement position.

The beam monitor 102 may include a slit disposed at a known position and a beam detector arranged at the downstream of the slit. The beam detector has beam detection elements arranged one-dimensionally or two-dimensionally, for example. A traveling direction of the ion beam B can be obtained from a relative position of a beam arrival point detected by the beam detector with respect to the slit. The beam monitor 102 may be movable in a plane perpendicular to the reference trajectory (e.g., in the beam scan direction) and may measure the beam angle at an arbitrary position in the plane.

It is to be noted that the beam monitor 102 may be arranged between the beam collimator 36 and the workpiece to measure the ion beam B at the upstream of the workpiece. Alternatively, the beam monitor 102 may be arranged at the back of the workpiece to measure the ion beam B at the downstream of the workpiece.

Also, the ion implanter 100 includes a control unit 104 configured to control an entirety or a part of the ion implanter 100 (e.g., an entirety or a part of the beamline unit). For example, the control unit 104 is configured to correct a deflection magnetic field in the steering electromagnet 30 or control the scan voltage in the beam scanner 34 based on a measurement result of the beam monitor 102.

The control unit 104 also controls operations of high-voltage power supplies configured to apply a variable constant voltage to electrode units provided in the beam transportation line unit 18. Here, the electrode units provided in the beam transportation line unit 18 are the collimating lens 84 in the beam collimator 36, the AEF electrodes 94 in the final energy filter 38, and the like. Also, the high-voltage power supplies that apply the variable constant voltage to these electrode units are the power supplies 91a and 91b for the collimating lens in the beam collimator 36, the power supplies 92a and 92b for the AEF electrodes in the final energy filter 38, and the like. In the present embodiment, by controlling a voltage applied to these electrode units with high accuracy, the accuracy of the parallelism and the incident angle of the ion beam implanted into the wafer 40 is made high, and the quality of the ion implantation process is improved.

Figure 4:
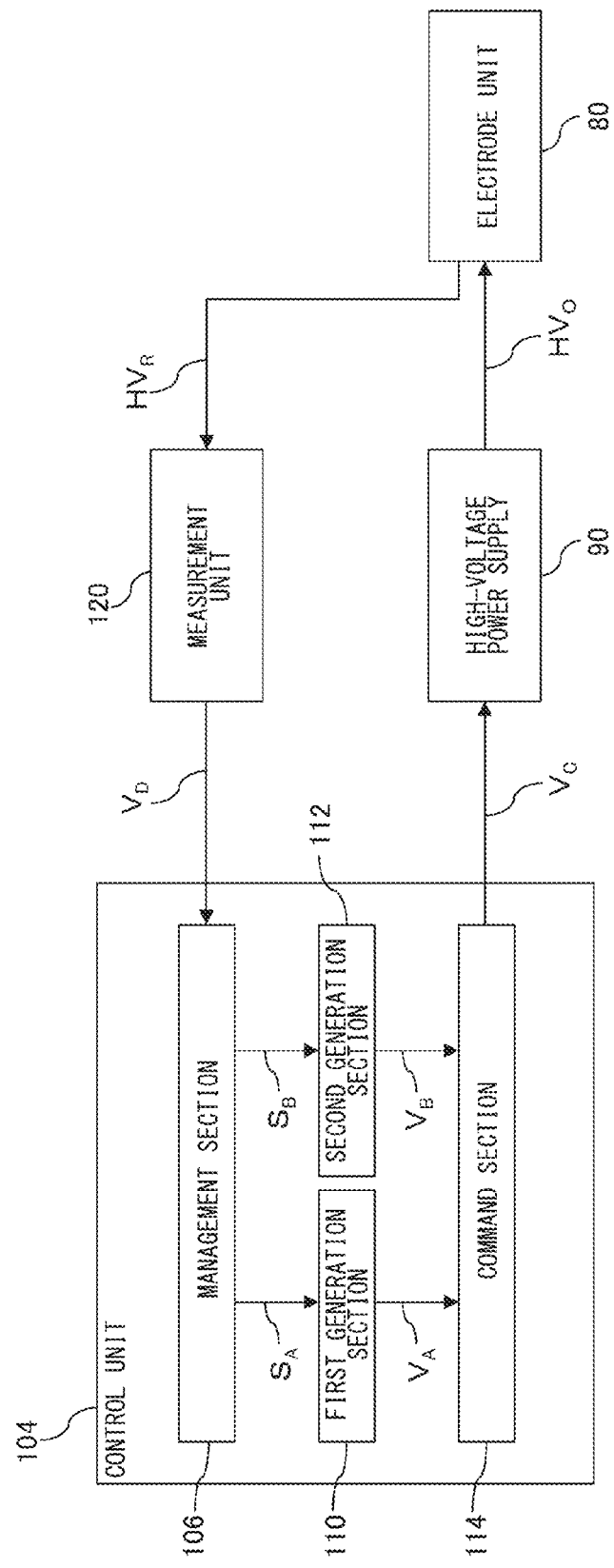
FIG. 4 is a block diagram illustrating a functional configuration of a control unit.

FIG. 4 is a block diagram illustrating a functional configuration of the control unit 104. The control unit 104 is connected with a high-voltage power supply 90 configured to apply a constant voltage $HV_O$ to an electrode unit 80 and a measurement unit 120 configured to measure an actual voltage $HV_R$ applied to the electrode unit 80. The control unit 104 transmits a command signal for controlling the output voltage of the high-voltage power supply 90 so that the actual voltage $HV_R$ measured by the measurement unit 120 becomes a target voltage or a voltage close to the target voltage.

Each block shown in the block diagram of the present description can be achieved by a device or a mechanical unit such as a CPU of a computer in terms of hardware and can be achieved by a computer program or the like in terms of software. Here, functional blocks achieved with a combination thereof are shown. Accordingly, it is to be understood by those skilled in the art that these functional blocks can be achieved in various manners with the combination of hardware and software.

The electrode unit 80 is a unit that includes an electrode body to which the output voltage $HV_O$ is applied from the high-voltage power supply 90, and examples thereof are a collimating lens electrode unit including the aforementioned collimating lens 84 and an angular energy filter electrode unit including the aforementioned AEF electrodes 94. The electrode unit 80 may be the aforementioned extraction electrode 11 configured to extract ions from the ion source 10 or may be any unit as long as it has an electrostatic electrode structure provided in the ion implanter 100. For example, the electrode unit 80 may be the suppression electrode 74 provided in the beam scanner 34 or the suppression electrode unit 98 provided in the final energy filter 38.

The high-voltage power supply 90 is a variable constant voltage power supply that outputs the output voltage $HV_O$ in accordance with a voltage value $V_C$ (hereinafter referred to as a command voltage $V_C$ as well) of a command signal transmitted from the control unit 104. The high-voltage power supply 90 includes a control terminal configured to receive the command signal from the control unit 104 and a high-voltage output terminal configured to output a desired high voltage. The control terminal of the high-voltage power supply 90 is connected with the control unit 104 while the high-voltage output terminal of the high-voltage power supply 90 is connected with the electrode body of the electrode unit 80.

Figure 5:
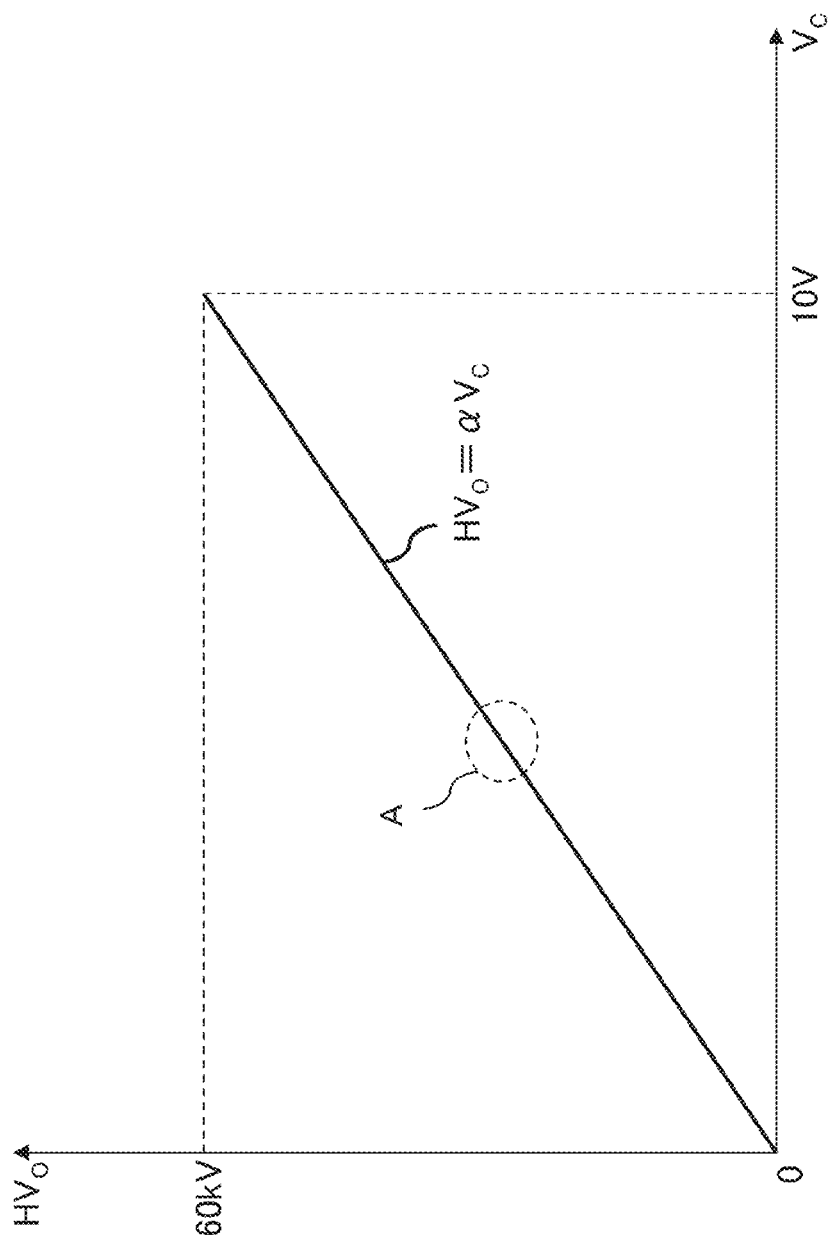
FIG. 5 is a graph schematically illustrating relation between a command voltage and an output voltage.

FIG. 5 is a graph schematically illustrating relation between the command voltage $V_C$ and the output voltage $HV_O$. The high-voltage power supply 90 outputs a value of the high voltage $V_O$ corresponding to the command voltage $V_C$ transmitted from the control unit 104 in accordance with the relation illustrated in the graph. FIG. 5 shows an example case in which the command voltage $V_C$ and the output voltage $HV_O$ are in proportional relation ($V_O=\alpha V_C$, where $\alpha$ is a proportionality coefficient), and in which the maximum voltage that can be output by the high-voltage power supply 90 is 60 kV. FIG. 5 also shows a case in which the output voltage $HV_O$ of 60 kV is output in reaction to the command voltage $V_C$ of 10 V, and proportionality coefficient $\alpha=6000$ is established. For example, when the command voltage $V_C=5V$ is given, the output voltage $HV_O=30$ kV is obtained. Meanwhile, the relation between the output voltage $HV_O$ and the command voltage $V_C$ in the high-voltage power supply 90 is not necessarily, a proportional relation and may be relation expressed as $HV_O=f(V_C)$ by an arbitrary function f.

Returning to FIG. 4, the measurement unit 120 will be described. The measurement unit 120 is a measuring instrument for measuring the actual voltage $HV_R$ applied to the electrode unit 80. The measurement unit 120 includes a high voltage divider configured to measure the actual voltage $HV_R$, which is a high voltage, and outputs a divided measurement voltage $V_D$ to the control unit 104.

Figure 6:
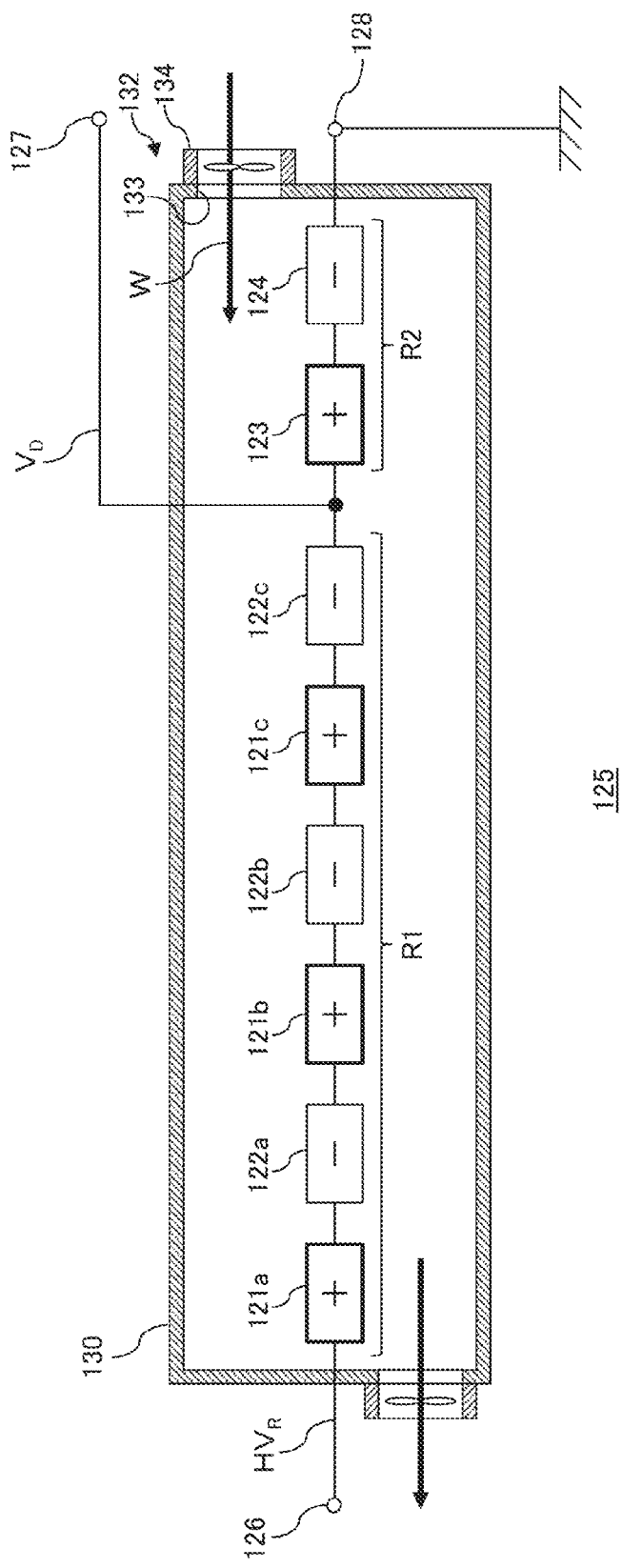
FIG. 6 schematically illustrates a configuration of a high-voltage divider included in a measurement unit.

FIG. 6 schematically illustrates a configuration of a voltage divider 125 included in the measurement unit 120. The voltage divider 125 includes first resistors 121*a*-*c*, second resistors 122*a*-*c*, a third resistor 123, a fourth resistor 124, a measurement terminal 126, a voltage-dividing terminal 127, and a reference terminal 128.

Between the measurement terminal 126 and the voltage-dividing terminal 127, a plurality of resistors, that is, one or more first resistors 121*a*-*c* and one or more second resistors 122*a*-*c*, are connected in series. Each of the first resistors 121*a*-*c* is a positive temperature coefficient resistor having a positive (+) temperature coefficient in a resistance characteristic, and each of the second resistors 122*a*-*c* is a negative temperature coefficient resistor having a negative (−) temperature coefficient in the resistance characteristic. By combining the positive temperature coefficient resistors with the negative temperature coefficient resistors, a change of a first resistance value R1, which is a total resistance value between the measurement terminal 126 and the voltage-dividing terminal 127, due to a temperature, can be lowered. Meanwhile, to keep the change of the resistance value small, the number of the first resistors 121*a*-*c* each having a positive temperature coefficient and the number of the second resistors 122*a*-*c* each having a negative temperature coefficient are preferably equal. More preferably, the total resistance value of the first resistors 121*a*-*c* each having a positive temperature coefficient and the total resistance value of the second resistors 122*a*-*c* having a negative temperature coefficient are equal.

Between the voltage-dividing terminal 127 and the reference terminal 128, a plurality of resistors, that is, one or more third resistors 123 and one or more fourth resistors 124, are connected in series. Each of the third resistors 123 is a positive temperature coefficient resistor, and each of the fourth resistors 124 is a negative temperature coefficient resistor. By combining the positive temperature coefficient resistors with the negative temperature coefficient resistors in a similar manner to the first resistance value R1 described above, a change of a second resistance value R2, which is a total resistance value between the voltage-dividing terminal 127 and the reference terminal 128, due to a temperature, can be lowered. Meanwhile, to keep the change of the resistance value small, the number of the third resistors 123 each having a positive temperature coefficient and the number of the fourth resistors 124 each having a negative temperature coefficient are preferably equal. More preferably, the total resistance value of the third resistors 123 and the total resistance value of the fourth resistors 124 are equal.

The measurement terminal 126 is connected with the electrode body of the electrode unit 80, and the actual voltage $HV_R$ to be applied to the electrode unit 80 is also applied to the measurement terminal 126. The reference terminal 128 is a terminal to which a reference voltage is applied, such as a ground terminal to which a ground potential is applied. The voltage-dividing terminal 127 is a terminal from which the divided measurement voltage $V_D$ can be supplied and is connected with the control unit 104. A voltage value of the measurement voltage $V_D$ is defined by the first resistance value R1 and the second resistance value R2 of the voltage divider 125 and is expressed as $V_D=HV_R \times R2/(R1+R2)$. For example, in a case in which three first resistors and three second resistors each having a resistance value of 500 MΩ are used, and in which one third resistor and one fourth resistor each having a resistance value of 150 kΩ are used, R1=3000 MΩ and R2=300 kΩ are established, and a voltage-dividing ratio becomes about 1:10000. Accordingly, by using the measurement voltage $V_D$ output to the voltage-dividing terminal 127 and the voltage-dividing ratio, the actual voltage $HV_R$ applied to the electrode unit 80 can be obtained. Also, by combining the positive temperature coefficient resistors with the negative temperature coefficient resistors as the plurality of resistors with which the voltage-dividing ratio is determined, a change of the voltage-dividing ratio of the resistors due to a temperature can be reduced, and a value of the actual voltage $HV_R$ can be derived with accuracy.

The voltage divider 125 includes a chassis 130 for storing the plurality of resistors and a cooling mechanism 132. The cooling mechanism 132 is adapted to cool the resistors provided inside the chassis 130 and includes a vent 133 and a cooling fan 134, for example. The cooling mechanism 132 cools the resistors with air by driving the cooling fan 134 to supply air through the vent 133 and making airflow (e.g., in a W direction) inside the chassis 130. This suppresses the temperature increase of the resistors caused by application of the high voltage and reduces the change of the voltage-dividing ratio due to the temperature so that a highly-accurate value of the actual voltage $HV_R$ may be obtained. Meanwhile, the cooling mechanism 132 may employ water cooling instead of air cooling. Also, the resistors may be provided with a heat sink or a Peltier element to improve the cooling efficiency.

Meanwhile, although FIG. 4 shows only one electrode unit 80 as an example, a plurality of electrode units 80 may be provided, and a plurality of high-voltage power supplies 90 may be provided to apply different direct-current high voltages respectively to the plurality of electrode units 80. A plurality of measurement units 120 may also be provided to enable to measure actual voltages applied to the respective electrode units 80. For example, four high-voltage power supplies 90 may be provided to correspond to the negative power supply 91a for the collimating lens, the positive power supply 91b for the collimating lens, the positive power supply 92a for the AEF electrode, and the negative power supply 92b for the AEF electrode, respectively. Meanwhile, the high-voltage power supply 90 may be configured to include a plurality of high-voltage output terminals so that each terminal can output an independent high voltage. In this case, one high-voltage power supply 90 may function to supply desired high voltages to the plurality of electrode units, respectively. Also, the measurement unit 120 may be configured not to include a voltage divider and may have another configuration enabling to measure the actual voltage $HV_R$ and output a measurement value representing the actual voltage $HV_R$ to the control unit 104.

Next, the functional configuration of the control unit 104 will be described. The control unit 104 includes a management section 106, a first generation section 110, a second generation section 112, and a command section 114. The first generation section 110 generates a first command signal based on a first command value $S_A$ from the management section 106, and the second generation section 112 generates a second command signal based on a second command value $S_B$ from the management section 106. The command section 114 generates a synthetic command signal which is produced by synthesizing the first command signal and the second command signal and transmits the synthetic command signal generated to the high-voltage power supply 90.

Each of the first generation section 110 and the second generation section 112 includes a D/A (Digital to Analog) converter that converts the digital command value $S_A$ or $S_B$ received from the management section 106 into the command signal having an analog command voltage $V_A$ or $V_B$. A first D/A converter included in the first generation section 110 generates the first command signal having the first command voltage $V_A$ based on the first command value $S_A$, and a second D/A converter included in the second generation section 112 generates the second command signal having the second command voltage $V_B$ based on the second command value $S_B$.

The first D/A converter and the second D/A converter have different voltage ranges that can be output from each other and are set so that the first D/A converter may have a wider voltage range that can be output than the second D/A converter. For example, the first D/A converter outputs the first command signal whose first command voltage $V_A$ is in the range of 0 V to 10 V while the second D/A converter outputs the second command signal whose second command voltage $V_B$ is in the range of −0.05 V to 0.05 V. Thus, the variation range of the output voltage $HV_O$ that can be adjusted by a change of the first command voltage $V_A$ is 0 to 60 kV while the variation range of the output voltage $HV_O$ that can be adjusted by a change of the second command voltage $V_B$ is −300 V to +300 V. That is, the variation range of the output voltage $HV_O$ that can be adjusted by a change of the second command voltage $V_B$ is set to be narrower than the variation range of the output voltage $V_O$ that can be adjusted by a change of the first command voltage $V_A$.

Each of the first D/A converter and the second D/A converter desirably has high resolution so as to enable fine adjustment of the command voltage to be transmitted to the high-voltage power supply 90. In the present embodiment, 16-bit D/A converters are used as the first D/A converter and the second D/A converter. When the 16-bit D/A converter is used, the command value can be used as 2-byte information, which is easy to use in the control unit 104. In the case of the 16 bits, in the first D/A converter, a minimal change (hereinafter referred to as a first unit command voltage $\Delta V_A$ as well) of the first command voltage $V_A$ corresponding to a change of the first command value by a unit amount (1 bit) is $\Delta V_A=10 \text{ V}/2^{16}=1.53\times 10^{-4}$ V. On the other hand, in the second D/A converter, a minimal change (hereinafter referred to as a second unit command voltage $\Delta V_B$ as well) of the second command voltage $V_B$ corresponding to a change of the second command value by a unit amount (1 bit) is $\Delta V_B=0.1 \text{ V}/2^{16}=1.53\times 10^{-6}$ V. Meanwhile, the resolution of the D/A converter is not limited to the 16 bits. The D/A converter having higher or lower resolution than the 16 bits may be used.

The command section 114 generates the synthetic command signal which is produced by synthesizing the first command signal generated in the first generation section 110 and the second command signal generated in the second generation section 112. The command section 114 includes an adder having a first input terminal connected with an output terminal of the first D/A converter, a second input terminal connected with an output terminal of the second D/A converter, and an output terminal. The adder adds the second command voltage $V_B$ of the second command signal to the first command voltage $V_A$ of the first command signal to generate the synthetic command signal having the synthetic command voltage $V_C=V_A+V_B$. The command section 114 outputs the synthetic command voltage obtained by the adder to the high-voltage power supply 90.

Figure 7:
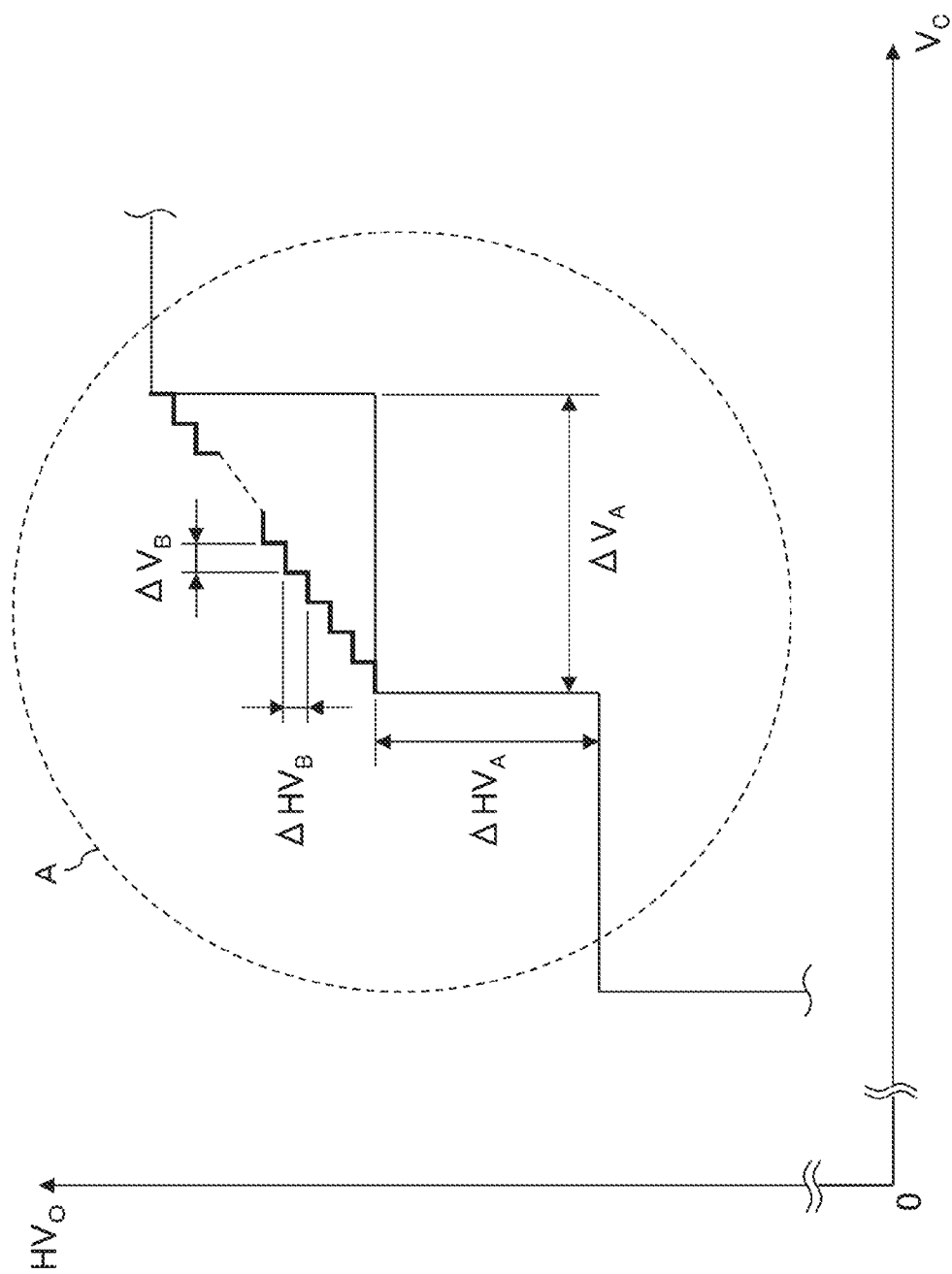
FIG. 7 is a graph schematically illustrating relation between a unit command voltage and a step voltage.

FIG. 7 is a graph schematically illustrating relation between the unit command voltage and a step voltage and an enlarged view of an area A illustrated in FIG. 5. FIG. 7 illustrates correspondence relation between the synthetic command voltage $V_C$ and the output voltage $HV_O$ and schematically illustrates a first step voltage $\Delta HV_A$ as a change amount of the output voltage $HV_O$ corresponding to the first unit command voltage $\Delta V_A$ and a second step voltage $\Delta HV_B$ as a change amount of the output voltage $HV_O$ corresponding to the second unit command voltage $\Delta V_B$. For example, in a case of the high-voltage power supply 90 in which the output voltage $HV_O$ of 60 kV is obtained from the command voltage $V_C$ of 10V, the first step voltage $\Delta HV_A$ corresponding to $\Delta V_A = 1.53 \times 10^{-4}$ V is approximately 0.92 V, and the second step voltage $\Delta HV_B$ corresponding to $\Delta V_B = 1.53 \times 10^{-6}$ V is approximately 0.009 V.

In this manner, in the present embodiment, the second step voltage $\Delta HV_B$ corresponding to a minimal change of the second command signal is smaller than the first step voltage $\Delta HV_A$ corresponding to a minimal change of the first command signal, and the ratio is $\Delta HV_B / \Delta HV_A = 1/100$. By making the step voltages different from each other, the output voltage $HV_O$ can be controlled roughly by the first command signal and can be adjusted finely by the second command signal. Meanwhile, the ratio of the step voltages is not limited to 1/100, and the control unit 104 may be configured so that $\Delta HV_B / \Delta HV_A = 1/10$ to 1/1000 or so is established, for example.

The management section 106 sets a target voltage $HV_T$ that is to be applied to the electrode unit 80 and transmits the first command value $S_A$ for allowing the high-voltage power supply 90 to output the target voltage $HV_T$ to the first generation section 110. The first command value $S_A$ includes a 16-bit command value corresponding to the 16-bit D/A converter, for example. The management section 106 sets the target voltage $HV_T$ based on a value measured by the beam monitor 102 and an input value received from a user via an interface section (not illustrated).

The management section 106 acquires the measurement voltage $V_D$ from the measurement unit 120 and calculates the actual voltage $HV_R$ applied to the electrode unit 80. To heighten the measurement accuracy of the actual voltage $HV_R$, the management section 106 may calculate an average value of the measurement voltages $V_D$ measured for a predetermined measurement period or perform statistical processing of the measurement voltages $V_D$. Also, the management section 106 may include an A/D (Analog to Digital) converter that converts the measurement voltage $V_D$ into a digital value and calculate a value of the actual voltage $HV_R$ with use of the digital value obtained by the A/D converter.

The management section 106 compares the actual voltage $HV_R$ with the target voltage $HV_T$ to derive a target correction voltage $\Delta HV = HV_T - HV_R$. The management section 106 transmits the second command value $S_B$ for complementing the target correction voltage $\Delta HV$ to the second generation section 112 so that the actual voltage $HV_R$ becomes the target voltage $HV_T$ or a voltage close to the target voltage $HV_T$. The target correction voltage $\Delta HV$ is calculated repeatedly at a predetermined update period, and the second command value $S_B$ for complementing the target correction voltage $\Delta HV$ is transmitted to the second generation section 112 per lapse of the update period. In a similar manner to the first command value $S_A$, the second command value $S_B$ includes a 16-bit command value corresponding to the 16-bit D/A converter, for example.

Next, the necessity for the complementary processing with use of the second command signal will be described. In a case of using the power supply control system illustrated in FIG. 4, when the command signal of the command voltage $V_C$ corresponding to the target voltage $HV_T$ is transmitted from the control unit 104 to the high-voltage power supply 90, the target voltage $HV_T$ is supposed to be applied to the electrode unit 80 as it is. For example, in a case of target voltage $HV_T = 30$ kV, command voltage $V_C = 5$ V should be set, and all that needs to be set may be first command voltage $V_A = 5$ V and second command voltage $V_B = 0$ V. However, the relation between the command voltage $V_C$ and the output voltage $HV_O$ illustrated in FIG. 5 is established under specific conditions, and a voltage in accordance with the relation illustrated in FIG. 5 may not be applied to the electrode unit 80 depending on the environment in which the high-voltage power supply 90 is placed. For example, in a case in which the output of the high-voltage power supply 90 has temperature dependency, the actual voltage $HV_R$ applied to the electrode unit 80 can change when the temperature of the high-voltage power supply 90 rises as it is turned on. Also, since the high-voltage output terminal of the high-voltage power supply 90 is connected with the electrode unit 80 and the measurement unit 120, the impedance of the entire control system may influence the high-voltage power supply 90, and the output voltage $HV_O$ of the high-voltage power supply 90 and the actual voltage $HV_R$ actually applied to the electrode unit 80 may not be equal to each other. In these cases, the electrostatic action amount that the electrode unit 80 gives to the ion beam may change, and the quality of the ion beam may be degraded. Under such circumstances, in the present embodiment, the second command signal is used to complement such a fluctuation of the applied voltage not resulting from a change of the command signal.

Figure 8:
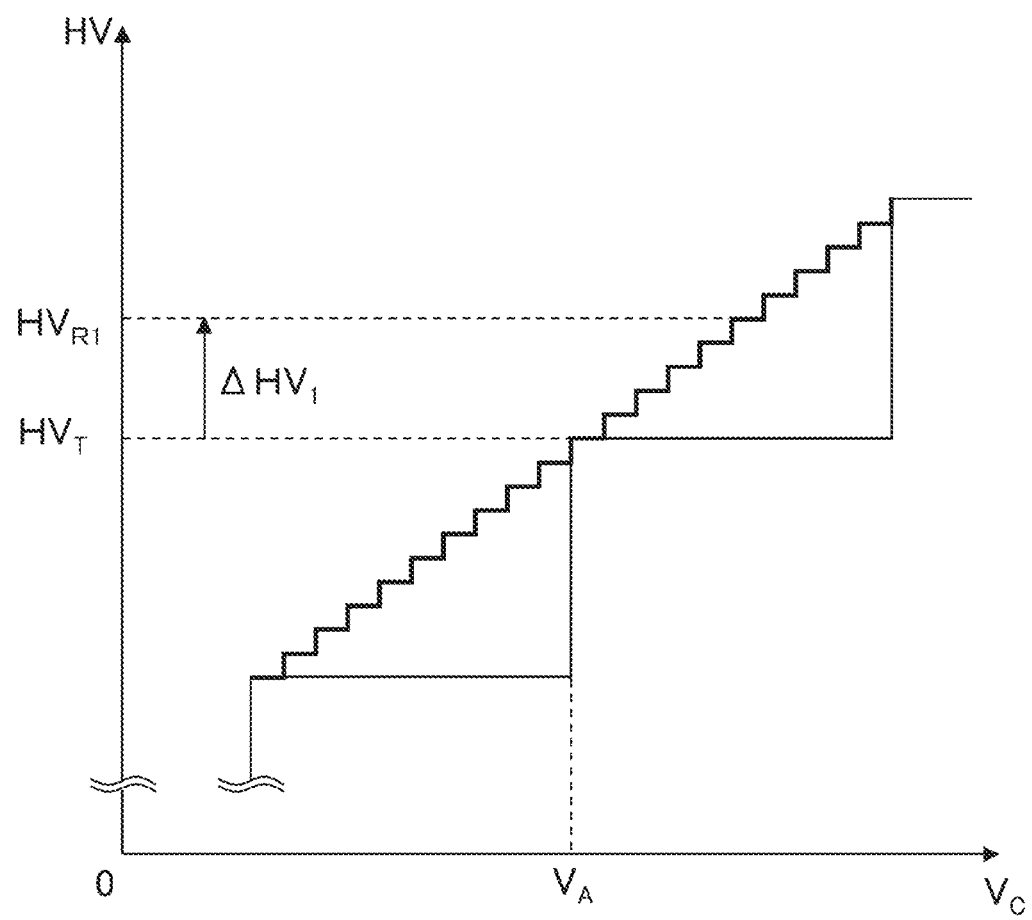
FIG. 8 is a graph illustrating a state in which there is a difference between a target voltage and an actual voltage.

FIG. 8 is a graph illustrating a state in which there is a difference between the target voltage $HV_T$ and an actual voltage $HV_{R1}$. FIG. 8 illustrates a state in which, although the first command voltage $V_A$ satisfying the relation of $HV_T = \alpha V_A$ with use of the proportionality coefficient $\alpha$ illustrated in FIG. 5 has been transmitted to the high-voltage power supply 90, the actual voltage $HV_{R1}$ measured by the measurement unit 120 differs from the target voltage $HV_T$. Suppose that the relation between the actual voltage $HV_R$ and the command voltage $V_C$ under a certain condition could be expressed as $HV_R = \beta V_C$, the proportionality coefficient $\beta$ defined here may differ from the proportionality coefficient $\alpha$ for the output voltage $HV_O$. Thus, even when the first command voltage $V_A$ for allowing the high-voltage power supply 90 to output the target voltage $HV_T$ is transmitted, the actual voltage $HV_{R1}$ applied to the electrode unit 80 may differ from the target voltage $HV_T$, and a difference voltage $\Delta HV_1 = HV_{R1} - HV_T$ may be generated.

Figure 9:
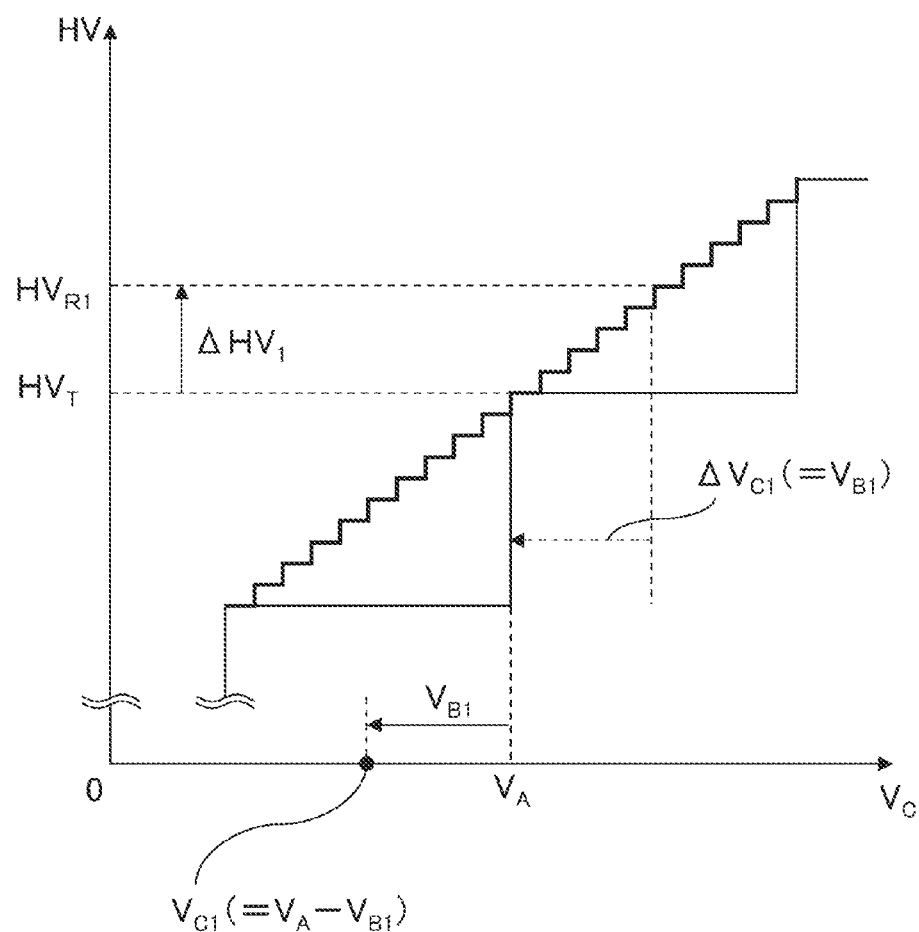
FIG. 9 is a graph illustrating a state in which the difference between the target voltage and the actual voltage is corrected.

FIG. 9 is a graph illustrating a state in which the difference between the target voltage $HV_T$ and the actual voltage $HV_{R1}$ is corrected and illustrates a correction command voltage $\Delta V_{C1}$ for complementing the target correction voltage $\Delta HV_1$. The correction command voltage $\Delta V_{C1}$ is equivalent to a voltage value required to change the output voltage $HV_O$ by the target correction voltage $\Delta HV_1$ and satisfies relation of $\Delta HV_1 = \alpha \Delta V_{C1}$. In the present embodiment, the second command signal having a second command voltage $V_{B1}$ which is equal to the correction command voltage $\Delta V_{C1}$ is used to correct the difference of the target correction voltage $\Delta HV_1$. Conversely, the first command voltage $V_A$ remains a value corresponding to the target voltage $HV_T$. Accordingly, as a result of this correction, a synthetic command voltage $V_{C1}$ to be transmitted to the high-voltage power supply 90 satisfies an equation of $V_{C1}=V_A-V_{B1}$ $(=V_A-\Delta V_{C1})$. In this manner, by transmitting the synthesized command signal complemented by the second command signal, the actual voltage $HV_R$ applied to the electrode unit 80 can become close to the target voltage $HV_T$.

Figure 10:
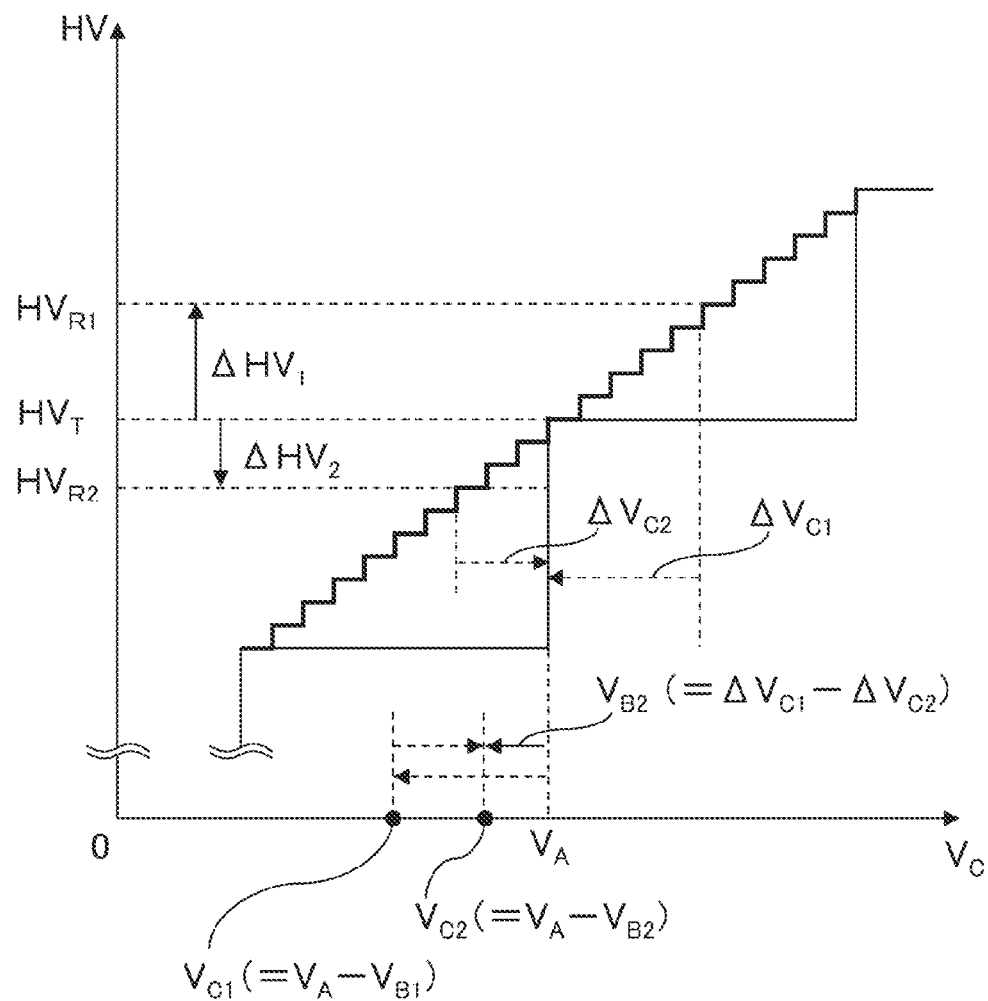
FIG. 10 is a graph illustrating a state in which the difference between the target voltage and the actual voltage is corrected.

FIG. 10 is a graph illustrating a state in which the difference between the target voltage $HV_T$ and an actual voltage $HV_{R2}$ is corrected and illustrates a state in which a second target correction voltage $\Delta HV_2$ generated by using the synthetic command voltage $V_{C1}$ illustrated in FIG. 9 is corrected. For example, in a case in which the relation between the actual voltage $HV_R$ and the command voltage $V_C$ under certain conditions is $HV_R=\beta V_C$, the second difference voltage $\Delta HV_2$ may remain even when correction is performed with use of the relation of $\Delta HV_1=\alpha\Delta V_{C1}$ using the proportionality coefficient $\alpha$ in the state illustrated in FIG. 9. To correct a difference of the second difference voltage $\Delta HV_2$, further correction is performed with use of the relation of $\Delta HV_2=\alpha\Delta V_{C2}$. Meanwhile, since the second command voltage $V_{B1}$ has already contained the first correction command voltage $\Delta V_{C1}$ for correcting the first target correction voltage $\Delta HV_1$, a second command voltage $V_{B2}$ after this correction satisfies an equation of $V_{B2}=\Delta V_{C1}-\Delta V_{C2}$. Conversely, the first command voltage $V_A$ remains a value corresponding to the target voltage $HV_T$. Accordingly, a synthetic command voltage $V_{C2}$ to be transmitted to the high-voltage power supply 90 satisfies an equation of $V_{C2}=V_A-V_{B2}$ $(=V_A-(\Delta V_{C1}-\Delta V_{C2}))$. In this manner, by updating the second command voltage $V_{B2}$, the actual voltage $HV_R$ applied to the electrode unit 80 can further become close to the target voltage $HV_T$.

The management section 106 periodically updates a value of the second command value $S_B$ to be transmitted to the second generation section 112 to make the actual voltage $HV_R$ close to and correspond to the target voltage $HV_T$. The timing of the update is every twenty seconds, for example. The management section 106 acquires the measurement voltage $V_D$ every two hundred milliseconds in twenty seconds of the update period and calculates the actual voltage $HV_R$ as a reference during this update period based on the measurement voltage $V_D$ acquired one hundred times to derive the target correction voltage $\Delta HV$. The management section 106 further calculates the correction command voltage $\Delta V_C$ for complementing the target correction voltage $\Delta HV$ and derives the new second command voltage $V_{B2}$ into which the value of the second command voltage $V_{BD}$ at the time of the previous update is corrected in consideration with the correction command voltage $\Delta V_C$. The management section 106 then generates the second command value $S_B$ expressing the value of the new second command voltage $V_{B2}$ and transmits it to the second generation section 112.

Meanwhile, the management section 106 may set an upper limit on the variation range of the output voltage that is changed at every update. The management section 106 may provide an "output voltage correction mode," in which the update of the second command signal is restricted so that the voltage variation of the output voltage caused by the update of the second command signal may be within a first threshold voltage on the operation to make the actual voltage $HV_R$ close to the target voltage $HV_T$. Here, the first threshold voltage means an upper limit value of the voltage variation at every update, and 200 V is set as the first threshold voltage, for example. In the "output voltage correction mode," even in a case in which the target correction voltage $\Delta HV$ exceeds 200 V, the voltage variation range at every update becomes within 200 V. In other words, the variation amount of the second command voltage $V_B$ at each update time is restricted so that the voltage variation range of the output voltage may be within a first threshold voltage $V_{T1}$. In a case of first threshold voltage $V_{T1}=200$ V and proportionality coefficient $\alpha=6000$, the upper limit of the variation amount of the second command voltage $V_B$ is $V_{T1}/\alpha=3.3\times10^{-2}$ V.

Figure 11:
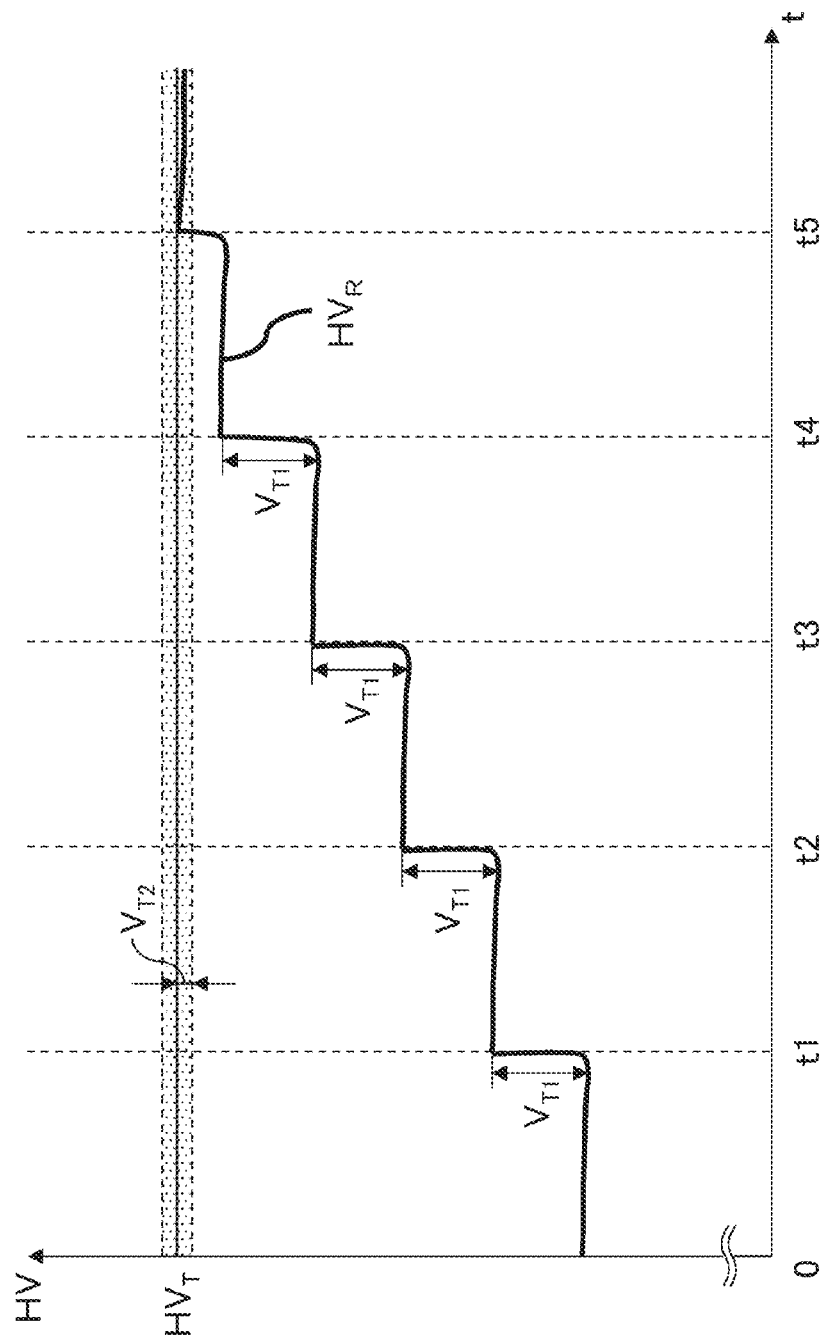
FIG. 11 is a graph illustrating a state of complementing the actual voltage in an output voltage correction mode.

FIG. 11 is a graph illustrating a state of complementing the actual voltage $HV_R$ in the output voltage correction mode and illustrates a state in which the actual voltage $HV_R$ is made to be close to the target voltage $HV_T$ under conditions where the voltage variation range at each update time t1 to t5 is restricted within the first threshold voltage $V_{T1}$. If the voltage variation range at each update time were not restricted, the output voltage could change by more than the target correction voltage $\Delta HV$ at every update. In this case, a voltage above the target voltage $HV_T$ and a voltage below the target voltage $HV_T$ would be output alternately at every update, and the actual voltage $HV_R$ might be unstable. On the other hand, as illustrated in FIG. 11, by restricting the voltage variation range at every update, the actual voltage $HV_R$ can be made to be close to the target voltage $HV_T$ gradually, and thus the actual voltage $HV_R$ can be made to be close to the target voltage $HV_T$ in a stable manner.

The management section 106 may provide an "output voltage stabilization mode," in which the voltage variation of the output voltage caused by the update of the second command signal is further restricted in a case in which the actual voltage $HV_R$ is close to the target voltage $HV_T$. In the "output voltage stabilization mode," when the target correction voltage $\Delta HV$ is within a second threshold voltage $V_{T2}$, which is smaller than the first threshold voltage $V_{T1}$, the voltage variation of the output voltage caused by the update of the second command signal is within the second threshold voltage $V_{T2}$ at the subsequent update times. In other words, the variation amount of the second command voltage $V_B$ at each update time is restricted so that the voltage variation range of the output voltage may be within the second threshold voltage $V_{T2}$. For example, in a case of second threshold voltage $V_{T2}=2$ V and proportionality coefficient $\alpha=6000$, the upper limit of the variation amount of the second command voltage $V_B$ is $V_{T2}/\alpha=3.3\times10^{-4}$ V.

FIG. 11 illustrates a state in which, at the update time t5, the target correction voltage $\Delta HV$, which is a difference between the actual voltage $HV_R$ and the target voltage $HV_T$, is within the second threshold voltage $V_{T2}$. The management section 106 restricts the voltage variation range at each update time within the second threshold voltage $V_{T2}$ at update times subsequent to the update time t5.

Figure 12:
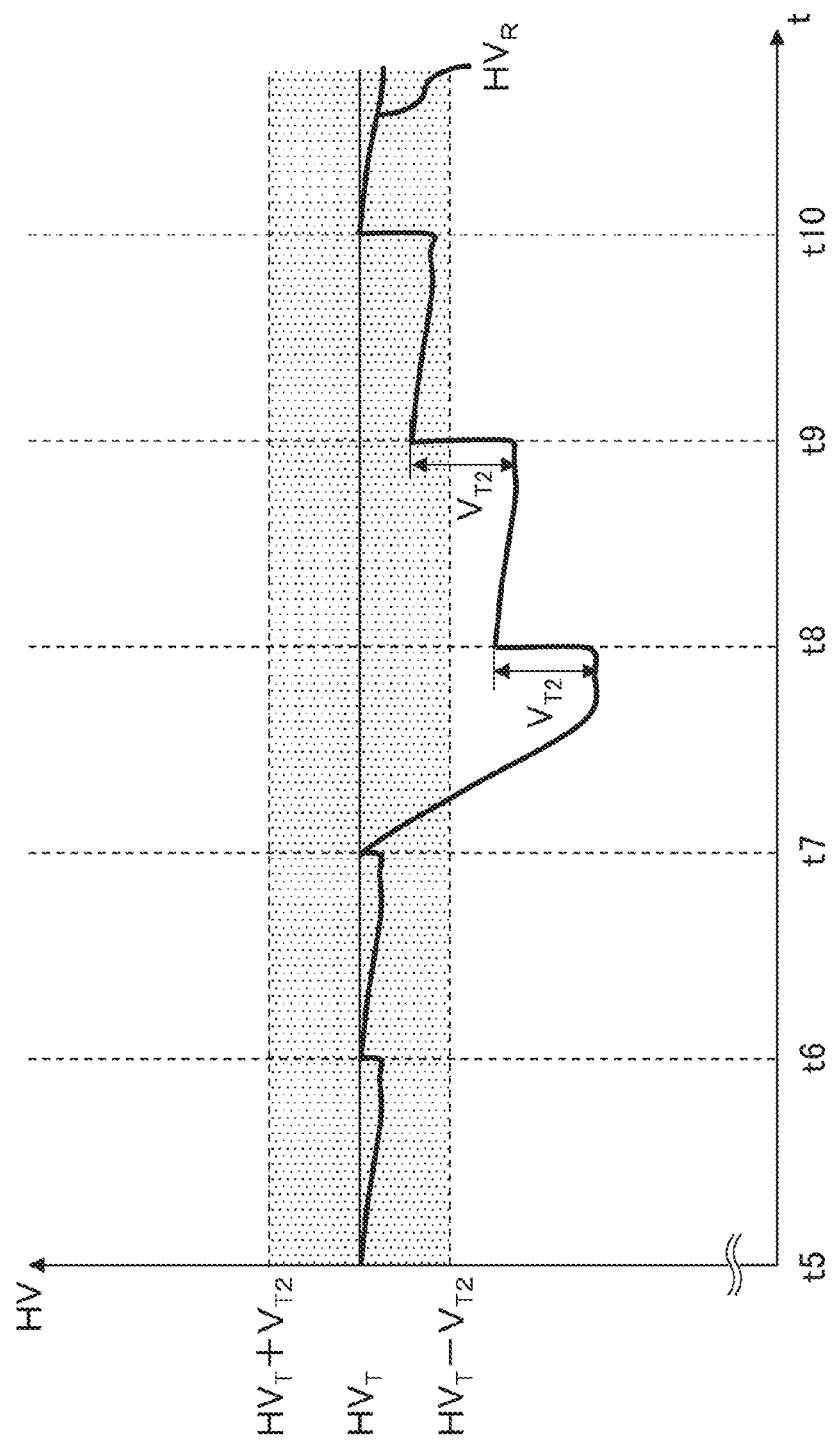
FIG. 12 is a graph illustrating a state of complementing the actual voltage in an output voltage stabilization mode.

FIG. 12 is a graph illustrating a state of complementing the actual voltage $HV_R$ in the output voltage stabilization mode and illustrates the transition of the actual voltage $HV_R$ at update times subsequent to the update time t5 illustrated in FIG. 11. When the difference from the target voltage $HV_T$ is within the second threshold voltage $V_{T2}$, the management section 106 switches the mode to the output voltage stabilization mode. In a case in which a temporary voltage variation occurs in a state in which the actual voltage $HV_R$ is stabilized close to the target voltage $HV_T$, if the actual voltage $HV_R$ is changed too much, the actual voltage $HV_R$ may rather be unstable. In the output voltage stabilization mode, however, as illustrated in the update times t8 and t9 in FIG. 12, even in a case in which the target correction voltage $\Delta HV$ exceeds the second threshold voltage $V_{T2}$, the voltage variation range at every update is within the second threshold voltage $V_{T2}$. Hence, during the period of operating the ion implanter, the actual voltage $HV_R$ can be stabilized so as to correspond to or be close to the target voltage $HV_T$. Accordingly, the quality of the ion implantation process can be improved.

Figure 13:
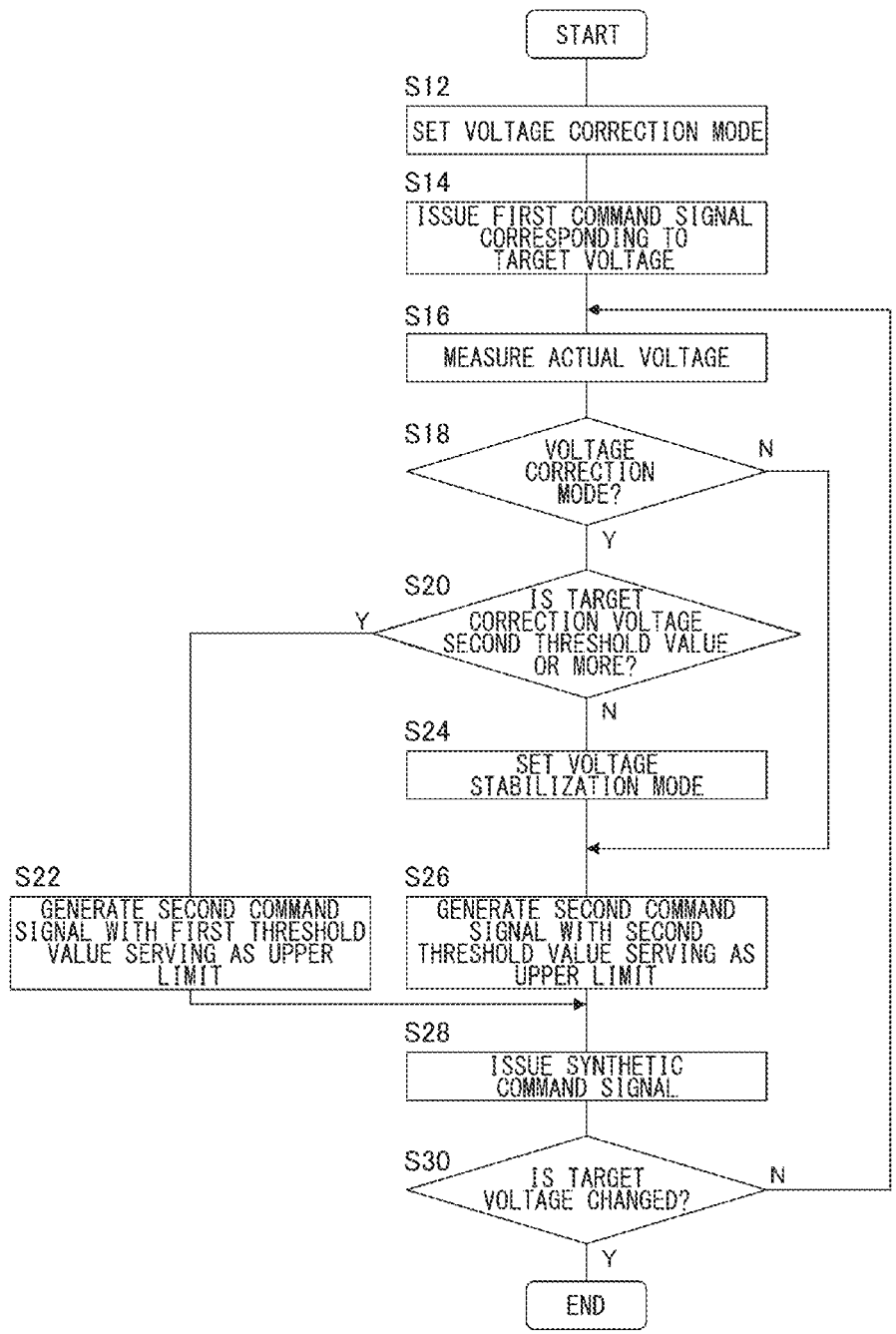
FIG. 13 is a flowchart illustrating operations of voltage control performed by the control unit.

FIG. 13 is a flowchart illustrating operations of voltage control performed by the control unit 104. The control unit 104 sets the operation mode for voltage control to the output voltage correction mode (S12), issues the first command signal having the first command voltage $V_A$ corresponding to the target voltage $HV_T$ to the high-voltage power supply 90 (S14), and measures the actual voltage $HV_R$ applied to the electrode unit 80 via the measurement unit 120 (S16). When the operation mode is the output voltage correction mode (Y in S18), and when the target correction voltage ΔHV is equal to the second threshold voltage $V_{T2}$ or more (Y in S20), the control unit 104 generates the second command signal so that the upper limit of the voltage variation may be the first threshold voltage $V_{T1}$ (S22). Conversely, When the target correction voltage ΔHV is less than the second threshold voltage $V_{T2}$ (N in S20), the control unit 104 sets the operation mode for voltage control to the output voltage stabilization mode (S24) and generates the second command signal so that the upper limit of the voltage variation may be the second threshold voltage $V_{T2}$ (S26).

The control unit 104 thereafter generates the synthetic command signal which is produced by synthesizing the first command signal and the second command signal and issues the synthetic command signal to the high-voltage power supply 90 (S28). In a case in which the target voltage is changed (Y in S30), this flow ends. In a case in which the target voltage is not changed (N in S30), the steps S16 to S28 are repeated. Meanwhile, in a case in which the operation mode is set to the output voltage stabilization mode in S26 before the steps S16 to S28 are repeated (N in S18), the steps S20 to S24 are skipped, and the control unit 104 generates the second command signal so that the upper limit of the voltage variation may be the second threshold voltage $V_{T2}$ (S26) and issues the synthetic command signal including the second command signal to the high-voltage power supply 90 (S28).

With the ion implanter 100 according to the present embodiment, since the actual voltage $HV_R$ applied to the electrode unit 80 is measured with use of the measurement unit 120, and the output voltage is corrected based on the measured actual voltage $HV_R$, the actual voltage $HV_R$ equal to or close to the target voltage $HV_T$ can be obtained. For example, in a case in which a read-back output stored in the high-voltage power supply 90 is a reference, heat generated from the high-voltage power supply 90 may cause temperature drift, and a difference may be generated between the actual voltage $HV_R$ and the read-back output. In this case, the feedback control is performed based on the wrong reference voltage, the actual voltage $HV_R$ is off the target voltage $HV_T$, and an ion beam having desired quality may not be obtained. According to the present embodiment, since the actual voltage $HV_R$ applied to the electrode unit 80 is measured with use of the measurement unit 120, in which the resistors each having a positive or negative temperature coefficient are combined, occurrence of a measurement error caused by a temperature change can be suppressed. Accordingly, the actual voltage $HV_R$ applied to the electrode unit 80 can correspond to or be close to the target voltage $HV_T$ with high accuracy.

Also, according to the present embodiment, the command signal into which the first command signal and the second command signal are synthesized is transmitted to the high-voltage power supply 90. By combining the first command signal having a wider voltage range that can be set and the second command signal in which a setting voltage per unit amount is smaller than the first command signal, the output voltage can be set with high accuracy over a wide voltage range. Especially, to the collimating lens electrode unit or the angular energy filter electrode unit included in the ion implanter 100, different voltages may be applied depending on the various conditions such as the ion species, the electric charge, the energy, and the current amount of the ion beam that is to be irradiated to the wafer. The setting range of the applied voltage widely ranges from a low voltage of about hundreds of V to a high voltage of about tens of kV. Also, to keep a stable beam quality, the applied voltage needs to be set with accuracy of 1% or less. According to the present embodiment, since the applied voltage can be stabilized with accuracy of about ±2 V, the accuracy of the applied voltage can be heightened to about 0.5% even in a case in which a low voltage about hundreds of V is applied. Also, a high voltage of about tens of kV can also be applied with use of the same power supply.

Further, according to the present embodiment, since the first command signal is fixed to a value corresponding to the target voltage while only the second command signal is used to complement the output voltage, the control method can be simplified further than in a case of controlling both the command signals.

Meanwhile, in a modification example, the output voltage may be controlled by changing both the voltage values of the first command signal and the second command signal. For example, in a case in which correction exceeding a voltage range that can be corrected by the second command signal is required, the voltage may be corrected roughly by the first command signal and may be corrected finely by the second command signal to be close to the target voltage. Also, in a case in which a value of the target voltage $HV_T$ is an intermediate voltage value that cannot be obtained by an interval of the first step voltage $\Delta HV_A$ corresponding to the first command signal, a signal into which the first command signal and the second command signal are synthesized may be used as a command signal for outputting the target voltage $HV_T$.

The embodiment has been described above, taking as an example the ion implanter 100 suitable as a high energy ion implanter. The present invention can be applied to another ion implanter including a beam deflector, a beam scanner, and a beam collimator. In an embodiment, for example, the present invention may be applied to control of an applied voltage to an electrode unit included in an ion implanter 200 not including the high energy multistage linear acceleration unit 14 as illustrated in FIG. 14.

Figure 14:
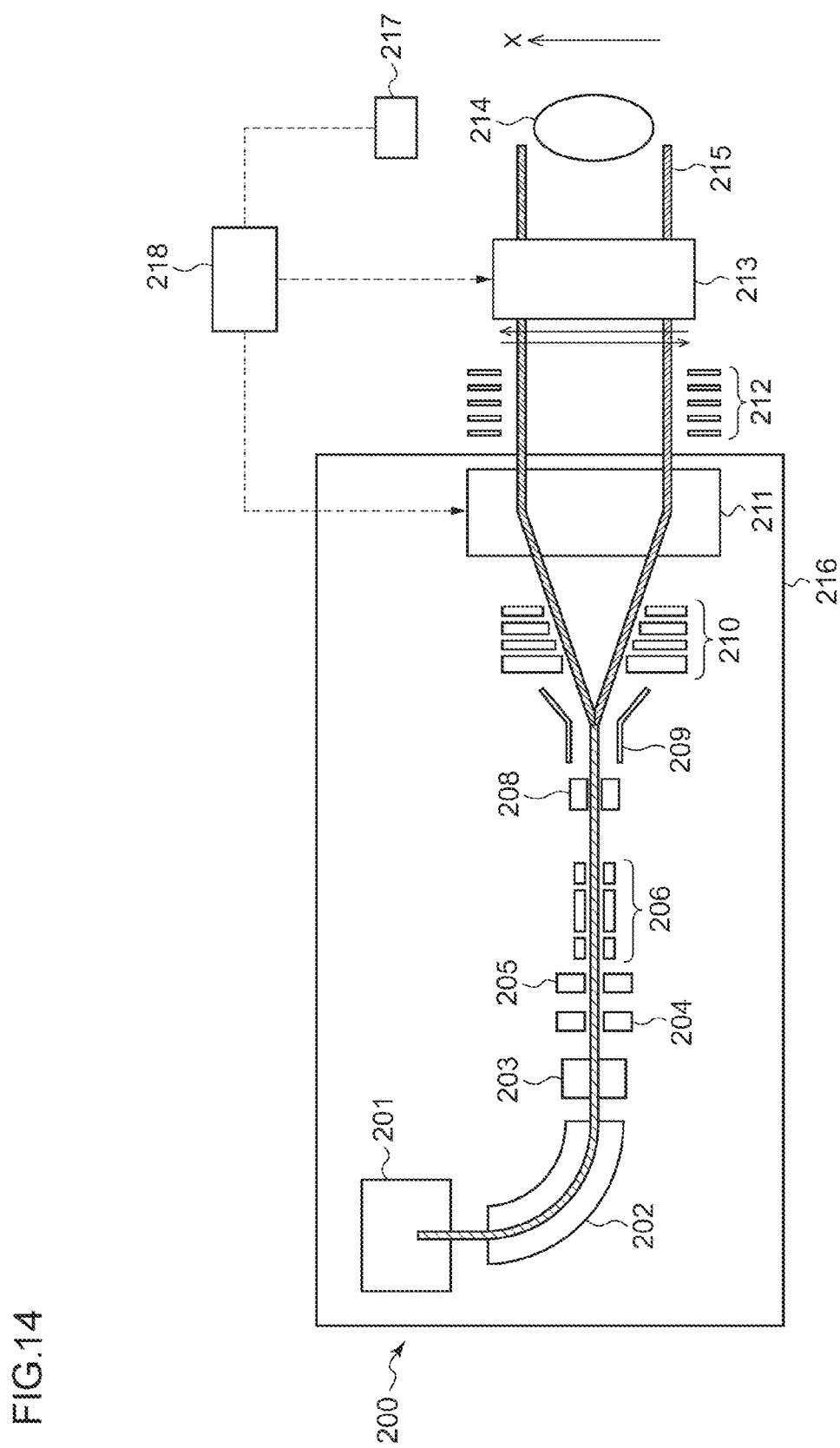
FIG. 14 is a plan view illustrating a schematic configuration of anion implanter according to another embodiment of the present invention.

FIG. 14 is a plan view illustrating a schematic configuration of the ion implanter 200 according to an embodiment of the present invention. The ion implanter 200 includes a plurality of beamline components as illustrated in the figure. A beamline upstream part of the ion implanter 200 includes an ion source 201, a mass analyzer 202, a beam dump 203, a resolving aperture 204, and a beam current modification mechanism 205 in this order from the upstream side. Between the ion source 201 and the mass analyzer 202 is provided an extraction electrode (not illustrated) configured to extract ions from the ion source 201. The beam current modification mechanism 205 includes a CVA (continuously variable aperture), for example. The CVA is an aperture whose aperture size can be adjusted by a driving mechanism.

A beamline downstream part of the ion implanter 200 includes a first XY focusing lens 206, a second XY focusing lens 208, a beam scanner 209, a Y focusing lens 210, a beam collimator 211, an AD (accel/decel) column 212, and an energy filter 213 in this order from the upstream side. A most downstream portion of the beamline downstream part is provided with a wafer 214. The beamline components from the ion source 201 to the beam collimator 211 are housed in a terminal 216. It is to be noted that, between the first XY focusing lens 206 and the second XY focusing lens 208 may be provided a beam current measuring instrument (not illustrated) which can be taken in and out of an ion beam path, for example.

The first XY focusing lens 206, the second XY focusing lens 208, and the Y focusing lens 210 constitutes a beam focusing/defocusing device configured to adjust a beam shape (a beam cross-section in an XY plane) in horizontal and vertical directions. In this manner, the beam focusing/defocusing device includes the plurality of lenses disposed along the beamline between the mass analyzer 202 and the beam collimator 211. The beam focusing/defocusing device can transport an ion beam to the downstream appropriately under conditions of a wide range of energy and beam current due to focusing/defocusing effects of these lenses.

The first XY focusing lens 206 is a Q lens, for example, the second XY focusing lens 208 is an X- and Y-directions einzel lens, for example, and the Y focusing lens 210 is a Y-direction einzel lens or a Q lens, for example. The first XY focusing lens 206, the second XY focusing lens 208, and the Y focusing lens 210 may be single lenses, or lens groups, respectively. In this manner, the beam focusing/defocusing device is designed to enable appropriate control of the ion beam under conditions from a condition of low energy and high beam current having a high beam potential and causing a problem of self-divergence of the beam to a condition of high energy and low beam current having a low beam potential and causing a problem of beam cross-sectional shape control.

The energy filter 213 is an AEF (angular energy filter) including a deflection electrode or a deflection electromagnet or both thereof, for example.

The ions generated in the ion source 201 are accelerated by an extraction electric field (not illustrated). The accelerated ions are deflected in the mass analyzer 202. In this manner, only ions having predetermined energy and a predetermined mass-to-charge ratio pass through the resolving aperture 204. Subsequently, the ions are guided via the beam current modification mechanism (CVA) 205, the first XY focusing lens 206, and the second XY focusing lens 208 to the beam scanner 209.

The beam scanner 209 applies a periodically changing electric field or magnetic field (or both) to scan the ion beam in the horizontal direction (or in the vertical direction or a diagonal direction) in a reciprocating manner. The ion beam is adjusted by the beam scanner 209 so as to be implanted into the wafer 214 uniformly in the horizontal direction. An ion beam 215 scanned by the beam scanner 209 is oriented in a traveling direction by the beam collimator 211 which uses application of the electric field or magnetic field (or both). The ion beam 215 is thereafter accelerated or decelerated to have predetermined energy by the AD column 212 by application of the electric field. The ion beam 215, which has exited from the AD column 212, reaches final implantation energy (in a low energy mode, however, the ion beam may be adjusted to have higher energy than the final implantation energy and may be deflected while being decelerated in the energy filter). The energy filter 213 at the downstream of the AD column 212 deflects the ion beam 215 to a direction of the wafer 214 by application of the electric field or magnetic field (or both) with use of the deflection electrode or the deflection electromagnet. By doing so, contamination components having energy other than targeted energy are eliminated. The ion beam 215 purified in this manner is implanted into the wafer 214.

Accordingly, the beamline upstream part of the ion implanter 200 includes the ion source 201 and the mass analyzer 202, and the beamline downstream part of the ion implanter 200 includes the beam focusing/defocusing device disposed at the upstream of the beam scanner 209 and adjusting focusing or defocusing of the ion beam, the beam scanner 209, and the beam collimator 211. The beam focusing/defocusing device may be the first XY focusing lens 206.

A beam monitor 217 is provided in the vicinity of the wafer 214. The beam monitor 217 is arranged at the downstream of the beam collimator 211 to measure the beam current, the position, the implantation angle, the convergence and divergence angle, the vertical and horizontal ion distribution, and the like of the ion beam B. The beam monitor 217 is configured in a similar manner to the beam monitor 102 described with reference to FIG. 1.

Also, the ion implanter 200 includes a control unit 218 configured to control an entirety or a part of the ion implanter 200 (e.g., an entirety or a part of the beamline unit). The control unit 218 is configured to control the beam focusing/defocusing device and/or the beam scanner based on a measurement result of the beam monitor 217. The control unit 218 is also configured to control operations of a high-voltage power supply for outputting a direct-current high voltage to each electrode unit such as an extraction electrode of the ion source 201 and electrode units constituting the beam collimator 211 and the energy filter 213 so that a desired target voltage may be applied to the electrode unit. The control unit 218 generates and transmits a command signal for controlling operations of the high-voltage power supply with use of an actual voltage measured by a measurement unit connected with the electrode unit.

The control unit 218 includes a first generation section that generates a first command signal for allowing the high-voltage power supply to output the target voltage, a second generation section that generates a second command signal for complementing the first command signal so that the actual voltage measured by the measurement unit may become the target voltage or a voltage close to the target voltage, and a command section that outputs to the high-voltage power supply a synthetic command signal which is produced by synthesizing the first command signal and the second command signal. By combining the first command signal and the second command signal complementing the first command signal, the actual voltage applied to the electrode unit can correspond to the target voltage with high accuracy.

Although the present invention has been described above with reference to the aforementioned respective embodiments, the present invention is not limited to the aforementioned respective embodiments and includes appropriate combinations and replacements of the components of the respective embodiments. Also, appropriate changes of combinations and the processing order in the respective embodiments and addition of modifications such as various design changes to the respective embodiments are available based on knowledge of those skilled in the art, and embodiments to which such modifications have been added can be included in the scope of the present invention.

The aforementioned configurations of the control unit, the electrode unit, and the measurement unit may be applied to a low energy ion implanter configured to obtain a relatively low-energy ion beam. Here, the low-energy ion beam is an ion beam having energy of about 0.2 keV to 50 keV. To obtain such an ion beam, an applied voltage of an extraction electrode for extracting ions from an ion source needs to be set with high accuracy. By using the control unit, the electrode unit, and the measurement unit according to the aforementioned embodiments, an extraction voltage can be set with high accuracy, and a high-quality low energy ion beam can be generated.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
a high-voltage power supply;
a control unit that generates a command signal controlling an output voltage of the high-voltage power supply;
an electrode unit to which the output voltage is applied; and
a measurement unit that measures an actual voltage applied to the electrode unit,
wherein
the control unit includes:
a first generation section that generates a first command signal for allowing the high-voltage power supply to output a target voltage;
a second generation section that generates a second command signal for complementing the first command signal so that the actual voltage measured by the measurement unit becomes the target voltage or a voltage close to the target voltage; and
a command section that brings to the high-voltage power supply a synthetic command signal which is produced by synthesizing the first command signal and the second command signal, wherein
each of the first generation section and the second generation section includes a D/A (Digital to Analog) converter that converts a digital command value into an analog command signal, and wherein
the command section brings to the high-voltage power supply the synthetic command signal which is produced by synthesizing the first command signal obtained by D/A-converting a first command value corresponding to the target voltage and the second command signal obtained by D/A-converting a second command value corresponding to a voltage value for complementing the actual voltage into the target voltage or the voltage close to the target voltage.

2. The ion implanter according to claim 1, wherein
a second step voltage as a minimal change amount of the output voltage corresponding to a change of the second command value by a unit amount is smaller than a first step voltage as a minimal change amount of the output voltage corresponding to a change of the first command value by a unit amount.

3. The ion implanter according to claim 2, wherein
the control unit is configured such that the second step voltage becomes $1/10$ to $1/1000$ of the first step voltage.

4. The ion implanter according to claim 2, wherein
the second generation section generates the second command signal to produce an intermediate value of voltage values within an interval of the first step voltage that the first generation section generates.

5. The ion implanter according to claim 1, wherein
a variation range of the output voltage that can be controlled by a change of the second command value is narrower than a variation range of the output voltage that can be controlled by a change of the first command value.

6. The ion implanter according to claim 1, wherein
the second generation section generates the second command signal to complement a voltage fluctuation of the output voltage not resulting from a change of the command signal.

7. The ion implanter according to claim 6, wherein
the second generation section generates the second command signal to complement the voltage fluctuation resulting from a temperature shift of the high-voltage power supply.

8. The ion implanter according to claim 1, further comprising:
a beam scanner that causes an ion beam for ion implantation to be scanned in a predetermined scanning direction in a reciprocating manner; and
a collimating lens electrode unit that collimates the ion beam scanned in the reciprocating manner by the beam scanner,
wherein
the high-voltage power supply outputs a direct-current high voltage to the collimating lens electrode unit.

9. The ion implanter according to claim 1, further comprising:
an angular energy filter electrode unit that changes a traveling direction of the ion beam for the ion implantation,
wherein
the high-voltage power supply outputs the direct-current high voltage to the angular energy filter electrode unit.

10. The ion implanter according to claim 1, further comprising:
an ion source that generates ions; and
an extraction electrode that extracts ions from the ion source and produces the ion beam for the ion implantation, wherein
the high-voltage power supply outputs the direct-current high voltage to the extraction electrode.

11. An ion implanter comprising:
a high-voltage power supply;
a control unit that generates a command signal controlling an output voltage of the high-voltage power supply;
an electrode unit to which the output voltage is applied; and
a measurement unit that measures an actual voltage applied to the electrode unit,
wherein
the control unit includes:
a first generation section that generates a first command signal for allowing the high-voltage power supply to output a target voltage;
a second generation section that generates a second command signal for complementing the first command signal so that the actual voltage measured by the measurement unit becomes the target voltage or a voltage close to the target voltage; and
a command section that brings to the high-voltage power supply a synthetic command signal which is produced by synthesizing the first command signal and the second command signal, wherein
the control unit further includes a management section that allows the second generation section to update an output value of the second command signal per lapse of a predetermined update period based on a target correction voltage, which is a difference between the actual voltage measured during the predetermined update period and the target voltage, and wherein the management section provides an output voltage correction mode, in which an update of the second command signal is restricted so that the voltage fluctuation of the output voltage caused by the update of the second command signal is within a first threshold voltage.

12. The ion implanter according to claim 11, wherein
the management section provides an output voltage stabilization mode, in which the update of the second command signal is restricted so that the voltage variation of the output voltage caused by the update of the second command signal is within a second threshold voltage in subsequent update periods after a time when the target correction voltage is within the second threshold voltage, which is smaller than the first threshold voltage.

13. An ion implanter comprising:
a high-voltage power supply;
a control unit that generates a command signal controlling an output voltage of the high-voltage power supply;
an electrode unit to which the output voltage is applied; and
a measurement unit that measures an actual voltage applied to the electrode unit,
wherein
the control unit includes:
a first generation section that generates a first command signal for allowing the high-voltage power supply to output a target voltage;
a second generation section that generates a second command signal for complementing the first command signal so that the actual voltage measured by the measurement unit becomes the target voltage or a voltage close to the target voltage; and
a command section that brings to the high-voltage power supply a synthetic command signal which is produced by synthesizing the first command signal and the second command signal, wherein
the measurement unit includes a high-voltage divider configured to divide and measure the actual voltage applied to the electrode unit, and wherein
the high-voltage divider includes a combination of at least one positive temperature coefficient resistor having a positive temperature coefficient in resistance characteristic and at least one negative temperature coefficient resistor having a negative temperature coefficient in resistance characteristic.

14. The ion implanter according to claim 13, wherein
the high-voltage divider includes a measurement terminal connected with an output of the high-voltage power supply, a reference terminal connected with a reference voltage, and a voltage-dividing terminal provided between the measurement terminal and the reference terminal, wherein between the measurement terminal and the voltage-dividing terminal, the at least one positive temperature coefficient resistor and the at least one negative temperature coefficient resistor are connected in series, wherein between the voltage-dividing terminal and the reference terminal, the at least one positive temperature coefficient resistor and the at least one negative temperature coefficient resistor are connected in series, and wherein the actual voltage is derived by measuring a voltage of the voltage-dividing terminal.

15. The ion implanter according to claim 14, wherein
the positive temperature coefficient resistor and the negative temperature coefficient resistor provided between the measurement terminal and the voltage-dividing terminal are equal in number.

16. The ion implanter according to claim 14, wherein
the positive temperature coefficient resistor and the negative temperature coefficient resistor provided between the voltage-dividing terminal and the reference terminal are equal in number.

17. The ion implanter according to claim 13, wherein
the high-voltage divider further includes a cooling mechanism adapted to cool the positive temperature coefficient resistor and the negative temperature coefficient resistor.

18. A method of controlling an ion implanter including a high-voltage power supply, a control unit that generates a command signal controlling an output voltage of the high-voltage power supply, an electrode unit to which the output voltage is applied, and a measurement unit that measures an actual voltage applied to the electrode unit, the method comprising:

generating a first command signal for allowing the high-voltage power supply to output a target voltage, the first command being obtained by D/A-converting a first command value corresponding to the target voltage;

generating a second command signal for complementing the first command signal so that the actual voltage measured by the measurement unit becomes the target voltage or a voltage close to the target voltage, the second command signal being obtained by D/A-converting a second command value corresponding to a voltage value for complementing the actual voltage into the target voltage or the voltage close to the target voltage; and bringing to the high-voltage power supply a synthetic command signal which is produced by synthesizing the first command signal and the second command signal.

* * * * *